United States Patent
Hong et al.

(10) Patent No.: US 11,490,516 B2
(45) Date of Patent: Nov. 1, 2022

(54) POWER MODULE STRUCTURE

(71) Applicant: Delta Electronics (Shanghai) CO., LTD, Shanghai (CN)

(72) Inventors: Shouyu Hong, Shanghai (CN); Haibin Xu, Shanghai (CN); Wei Cheng, Shanghai (CN); Juan Cheng, Shanghai (CN); Tao Wang, Shanghai (CN); Zhenqing Zhao, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 632 days.

(21) Appl. No.: 16/502,175

(22) Filed: Jul. 3, 2019

(65) Prior Publication Data
US 2020/0029455 A1 Jan. 23, 2020

(30) Foreign Application Priority Data

Jul. 18, 2018 (CN) .......................... 201810790118.7
Jan. 23, 2019 (CN) .......................... 201910064451.4
Apr. 22, 2019 (CN) .......................... 201910323836.8

(51) Int. Cl.
*H05K 1/14* (2006.01)
*H05K 5/02* (2006.01)
(Continued)

(52) U.S. Cl.
CPC ........... *H05K 1/144* (2013.01); *H01L 23/492* (2013.01); *H05K 1/0296* (2013.01); *H05K 1/141* (2013.01);
(Continued)

(58) Field of Classification Search
CPC ...... H05K 1/0296; H05K 1/145; H05K 1/141; H05K 7/1432; H05K 7/1457;
(Continued)

(56) References Cited

U.S. PATENT DOCUMENTS

2006/0151874 A1 7/2006 Milich et al.
2010/0230800 A1* 9/2010 Beaupre ................ H01L 23/473
257/691

(Continued)

FOREIGN PATENT DOCUMENTS

CN 101582415 A 11/2009
CN 104040715 A 9/2014
(Continued)

OTHER PUBLICATIONS

The EP1OA dated Nov. 10, 2020 by the EPO.
(Continued)

*Primary Examiner* — Hoa C Nguyen
(74) *Attorney, Agent, or Firm* — Qinghong Xu

(57) ABSTRACT

A power module structure includes a first metal layer, a second metal layer, a third metal layer and a fourth metal layer, wherein the fourth metal layer is connected to the second metal layer via a connecting bridge; at least one first switch including a first end connected to the third metal layer and a second end connected to the second metal layer; and at least one second switch including a third end connected to the fourth metal layer and a fourth end connected to the first metal layer; wherein the projection of the first metal layer and the projection of the third metal layer are overlapped to form a first overlapping area; wherein the direction of the current flowing through the first metal layer is opposite to the direction of the current flowing through the third metal layer.

20 Claims, 43 Drawing Sheets

(51) Int. Cl.
*H05K 5/00* (2006.01)
*H01L 23/492* (2006.01)
*H05K 1/02* (2006.01)
*H01L 23/538* (2006.01)

(52) U.S. Cl.
CPC .......... *H05K 1/145* (2013.01); *H05K 5/0069* (2013.01); *H05K 5/0247* (2013.01); *H01L 23/5385* (2013.01); *H05K 2201/10053* (2013.01)

(58) Field of Classification Search
CPC ............... H05K 7/1482; H05K 7/1492; H05K 13/0885; H05K 2201/093–09345
See application file for complete search history.

(56) References Cited

U.S. PATENT DOCUMENTS

| | | | |
|---|---|---|---|
| 2012/0300522 A1* | 11/2012 | Tokuyama | H01L 25/072 257/691 |
| 2013/0015495 A1 | 1/2013 | Hauenstein | |
| 2014/0077354 A1 | 3/2014 | Yamamoto et al. | |
| 2014/0346676 A1 | 11/2014 | Horio et al. | |
| 2015/0243640 A1 | 8/2015 | Horio et al. | |
| 2017/0148770 A1* | 5/2017 | Ishino | H01L 23/3121 |
| 2018/0059749 A1 | 3/2018 | Chen et al. | |
| 2018/0102301 A1* | 4/2018 | Jeon | H01L 23/5386 |

FOREIGN PATENT DOCUMENTS

| | | |
|---|---|---|
| CN | 106256082 A | 12/2016 |
| CN | 106463501 A | 2/2017 |
| CN | 107155372 A | 9/2017 |
| CN | 107170714 A | 9/2017 |
| CN | 103779339 B | 11/2017 |
| CN | 107393901 A | 11/2017 |
| CN | 107464785 A | 12/2017 |
| CN | 207165543 U | 3/2018 |
| EP | 3104411 A1 | 12/2016 |
| EP | 3226294 A1 | 10/2017 |
| EP | 3343746 A1 | 7/2018 |
| EP | 3416189 | 12/2018 |
| JP | 2004214452 A | 7/2004 |
| JP | 4277169 B2 | 6/2009 |
| JP | 2011086769 A | 4/2011 |
| JP | 2016162777 A | 9/2016 |
| JP | 2018133481 A | 8/2018 |
| WO | 2013118415 A1 | 8/2013 |
| WO | 2016035651 A1 | 3/2016 |
| WO | 2016038955 A1 | 3/2016 |
| WO | 2017138414 A1 | 8/2017 |
| WO | 2018011969 A1 | 1/2018 |

OTHER PUBLICATIONS

The 1st Office Action dated Jan. 19, 2021 by the CNIPA from application No. 201811620061.2.
The Notice of Allowance dated Jan. 28, 2021 by the CNIPA from application No. 201910323836.8.
The EESR dated Jan. 3, 2020 by the EPO.
The 2nd Office Action dated Jul. 27, 2021 for EP patent application No. 19180703.1.
The CN1OA dated Nov. 23, 2020 by the CNIPA.
The Non-Final OA dated Nov. 13, 2020 by the USPTO.
The Notice of Allowance dated Jun. 15, 2021 for CN patent application No. 201811620061.2.
The JP1OA dated Aug. 25, 2020 by the JPO.
The EESR dated Oct. 10, 2019 by the EPO.

* cited by examiner

POWER MODULE STRUCTURE

CROSS REFERENCE

This application is based upon and claims the benefit of priority of Chinese Patent Application No. 201810790118.7, filed on Jul. 18, 2018, Chinese Patent Application No. 201910064451.4, filed on Jan. 23, 2019 and Chinese Patent Application No. 201910323836.8, filed on Apr. 22, 2019. The entire contents thereof are incorporated herein by reference.

TECHNICAL FIELD

The present disclosure relates to the field of power electronics, specifically to a power module structure.

BACKGROUND

As an important part of power conversion, modern power electronic equipments are widely used in the power, electronics, motor and energy industries. In order to ensure long-term stable operation of power electronic equipments and improving power conversion efficiency of power electronic equipments has been an important goal of those skilled in the art.

As the core component of modern power electronic equipment, power semiconductor devices directly determine the reliability and power conversion efficiency of power electronic equipments. In order to design a reliable, safe, and high-performance power electronic equipments, it is desirable that the power semiconductor device has low voltage stress and low power loss. Power semiconductor devices used in power electronics equipments operate in a switching mode, and high frequency switching will induce a high current change rate di/dt in the wires. Therefore, a voltage Vs is caused by the changed current applied on the stray inductance $L_{stray}$ and is calculated as followed.

$$V_s = L_{stray} di/dt$$

Therefore, a higher voltage spike is caused by larger stray inductance when the current change rate keeps in constant. The voltage spike will reduce the device reliability and increase turn off loss of the device. The device is allowed to switch faster with smaller gate resistance as the line stray inductance is reduced, which have lower switching losses and higher efficiency of the converter.

In summary, the requirement of reducing the stray inductance is proposed. It is necessary to need a package structure for reducing the stray inductance.

SUMMARY

In one embodiment of the present disclosure, a power module structure includes a first metal layer disposed on a first reference plane; a second metal layer disposed on the first reference plane, wherein the second metal layer is adjacent to the first metal layer; a third metal layer disposed on a second reference plane, wherein the second reference plane is parallel to the first reference plane; a fourth metal layer disposed on the second reference plane, wherein the fourth metal layer is adjacent to the third metal layer and is connected to the second metal layer via a connecting bridge; at least one first switch including a first end connected to the third metal layer and a second end connected to the second metal layer; and at least one second switch including a third end connected to the fourth metal layer and a fourth end connected to the first metal layer. The projection of the first metal layer and the projection of the third metal layer are overlapped on the first reference plane or on the second reference plane to form a first overlapping area. The direction of the current flowing through the first metal layer is opposite to the direction of the current flowing through the third metal layer.

By using the power module structure of the present disclosure, since the projection, projected on the first reference plane or on the second reference plane, of the first metal layer is overlapped with the projection, projected on the first reference plane or the second reference plane, of the third metal layer and the current flowing through the first metal layer is opposite to the current flowing through the third metal layer, the goal of the cancellation of the inductance is achieved and the stray inductance of the power module is then reduced.

In one embodiment of the present disclosure, a power module structure includes a first metal layer disposed on a first reference plane; a second metal layer disposed on a second reference plane, wherein the second reference plane is parallel to the first reference plane; a third metal layer disposed on the second reference plane, wherein the third metal layer is adjacent to the second metal layer; a fourth metal layer disposed between the first reference plane and the second reference plane, wherein the fourth metal layer is parallel to the first reference plane or the second reference plane; a first switch including a first end connected to the second metal layer and a second end connected to the first metal layer; and a second switch including a third end connected to the first metal layer and a fourth end connected to the third metal layer. The fourth metal layer is electrically connected to one of the second metal layer and the third metal layer. A projection of the fourth metal layer is overlapped with a projection of the other metal layer of the second metal layer and the third metal layer on the first reference plane or on the second reference plane to form a overlapping area. The direction of the current flowing through the fourth metal layer is opposite to the direction of the current flowing through the other metal layer.

By using the power module structure of the present disclosure, since the projection, projected on the first reference plane or on the second reference plane, of the fourth metal layer is overlapped with the projection, projected on the first reference plane or the second reference plane, of the second metal layer or the third metal layer, and the current flowing through the fourth metal layer is opposite to the current flowing through the second metal layer or the third metal layer, the goal of the cancellation of the inductance is achieved and the stray inductance of the power module is then reduced.

In order to further understand the features and technical contents of the present disclosure please refer to the following detailed description and drawings related to the present disclosure. However, the detailed description and the drawings are merely illustrative of the disclosure and are not intended to limit the scope of the claims.

BRIEF DESCRIPTION OF THE DRAWINGS

Embodiments of the present disclosure will now be described, by way of example only, with reference to the accompanying schematic drawings in which corresponding reference symbols indicate corresponding parts, and in which.

DETAILED DESCRIPTION

Figure 1:
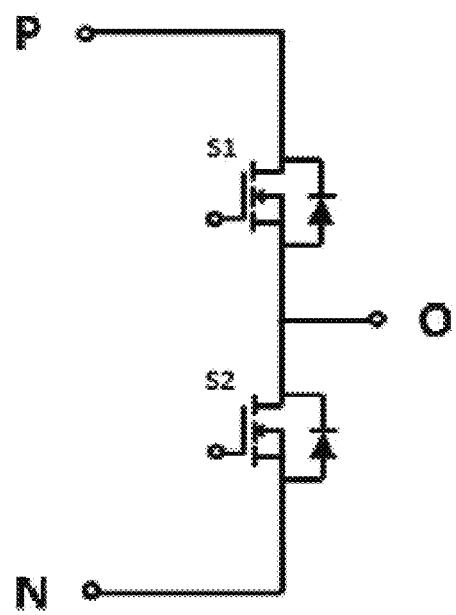
FIG. 1 shows a schematic view of a prior art of equivalent circuits of a half-bridge module.
Figure 2:
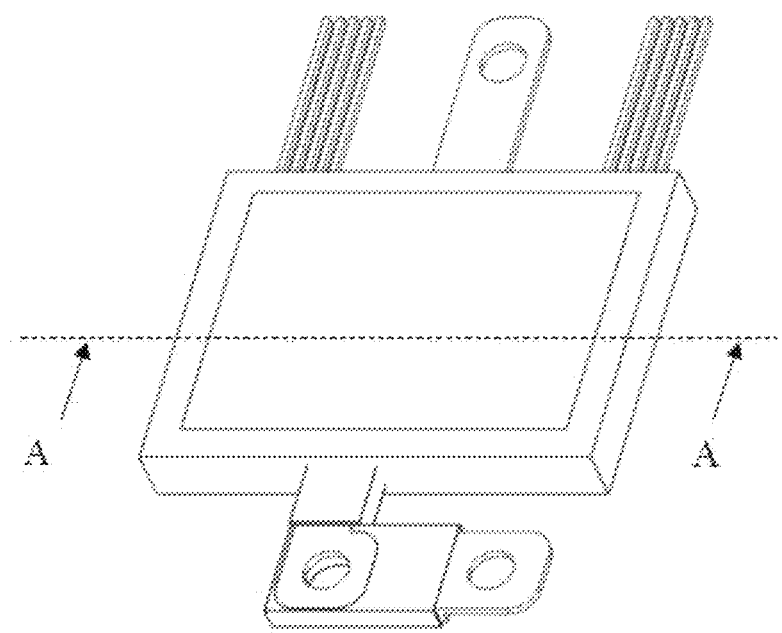
FIG. 2 shows a schematic view of a packaged power module structure of a first embodiment of the present disclosure.

In the following, embodiments of the present disclosure will be described in detail referring to figures. The concept and its realizations of the present disclosure can be implemented in a plurality of forms, and should not be understood to be limited to the embodiments described hereafter. In contrary, these embodiments are provided to make the present disclosure more comprehensive and understandable, and so the conception of the embodiments can be conveyed to the technicians in the art fully. Same reference signs in the figures refer to same or similar structures, so repeated description of them will be omitted.

The present disclosure provides a power module structure includes a first metal layer disposed on a first reference plane; a second metal layer disposed on the first reference plane, wherein the second metal layer is adjacent to the first metal layer; a third metal layer disposed on a second reference plane, wherein the second reference plane is parallel to the first reference plane; a fourth metal layer disposed on the second reference plane, wherein the fourth metal layer is adjacent to the third metal layer and is connected to the second metal layer via a connecting bridge; at least one first switch including a first end connected to the third metal layer and a second end connected to the second metal layer; and at least one second switch including a third end connected to the fourth metal layer and a fourth end connected to the first metal layer. In order to reduce the inductance of the power module, the projection of the first metal layer and the projection of the third metal layer are overlapped on the first reference plane or on the second reference plane to form a first overlapping area. The direction of the current flowing through the first metal layer is opposite to the direction of the current flowing through the third metal layer. Therefore, the stray inductance of the power module is then reduced as well.

As shown in FIGS. 1 to 30, in some embodiments, a first metal layer 41 is a metal layer electrically connected to an N pole. A second metal layer 42 and a fourth metal layer 44 are metal layers electrically connected to an O pole. A third metal layer 43 is a metal layer electrically connected to a P pole. In this embodiment, the P pole presents a positive electrode of a direct current (DC) bus. The N pole presents a negative electrode of the DC bus. The O pole presents an output electrode of the power module. A first power terminal 31 is a P pole power terminal and a second power terminal 32 is an N pole power terminal. A third power terminal 33 is a O pole power terminal. However, the present disclosure is not limited thereto.

In this embodiment, a projection, projected on the first reference plane or projected on the second reference plane, of a connecting area of the first metal layer 41 and the second power terminal 32 is overlapped with a projection, projected on the first reference plane or projected on the second reference plane, of a connecting area of the third metal layer 43 and the first power terminal 31.

FIG. 1 shows a schematic view of a prior art of equivalent circuits of a half-bridge module. As shown in FIG. 1, a first switch S1 is serially connected with a second switch S2. The first switch S1 includes a first end and a second end. The second switch S2 includes a third end and a fourth end. The P pole is electrically connected to the first end of the first switch S1. The N pole is electrically connected to the fourth end of the second switch S2. The second end of the first switch S1 is electrically connected to the third end of the second switch S2. The second end of the first switch S1 and the third end of the second switch S2 both are electrically connected to the O pole.

FIG. 2 to FIG. 6 shows a schematic view of a power module structure of a first embodiment of the present disclosure. In this embodiment, the power module structure includes a first substrate 21 parallel to a second substrate 22. Power components 28 are disposed between the two substrates. In this embodiment, the quantity of the power components 28 is not limited thereto. In some embodiments, the power components 28 include three first switches 281 and three second switches 282. A first power terminal 31 is connected to the first end of the first switch 281. A second power terminal 32 is electrically connected to the fourth end of the second switch 282. The second end of the first switch 281 is electrically connected to the third end of the second switch 282. The second end of the first switch 281 and the third end of the second switch 282 both are then electrically connected to the third power terminal 33. A signal terminal 23 is connected, via bonding wires 24, to a signal end of the power component 28. Moreover, projections, projected on the plane where the first substrate 21 or the second substrate 22 is located, of the components 28 are not overlapped with each other. Therefore, the components 28 are tile arranged between the first substrate 21 and the second substrate 22, such that the components 28 do not overlapped with each other.

Figure 4:
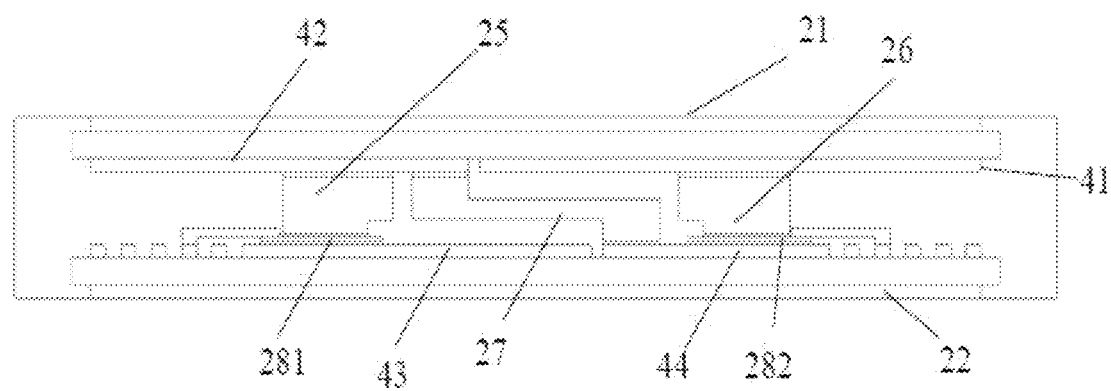
FIG. 4 shows a schematic cross-sectional view alone AA line of the packaged power module structure in FIG. 2.

As shown in FIG. 4, the power module structure includes the first substrate 21 presented as an upper substrate, wherein a lower surface of the first substrate 21 is presented as the first reference plane. The second substrate 22 is presented as a lower substrate, wherein an upper surface of the second substrate 22 is presented as the second reference plane. The first metal layer 41 and the second metal layer 42 are adjacently disposed on the first reference plane. The third metal layer 43 and the fourth metal layer 44 are adjacently disposed on the second reference plane. Moreover, the second metal layer 42 is connected to the fourth metal layer 44 via a connecting bridge 27. As shown in FIG. 4, the connecting bridge 27 is a connecting bridge with irregular shape which is configured to connect the second metal layer 42 and the fourth metal layer 44.

Figure 6:
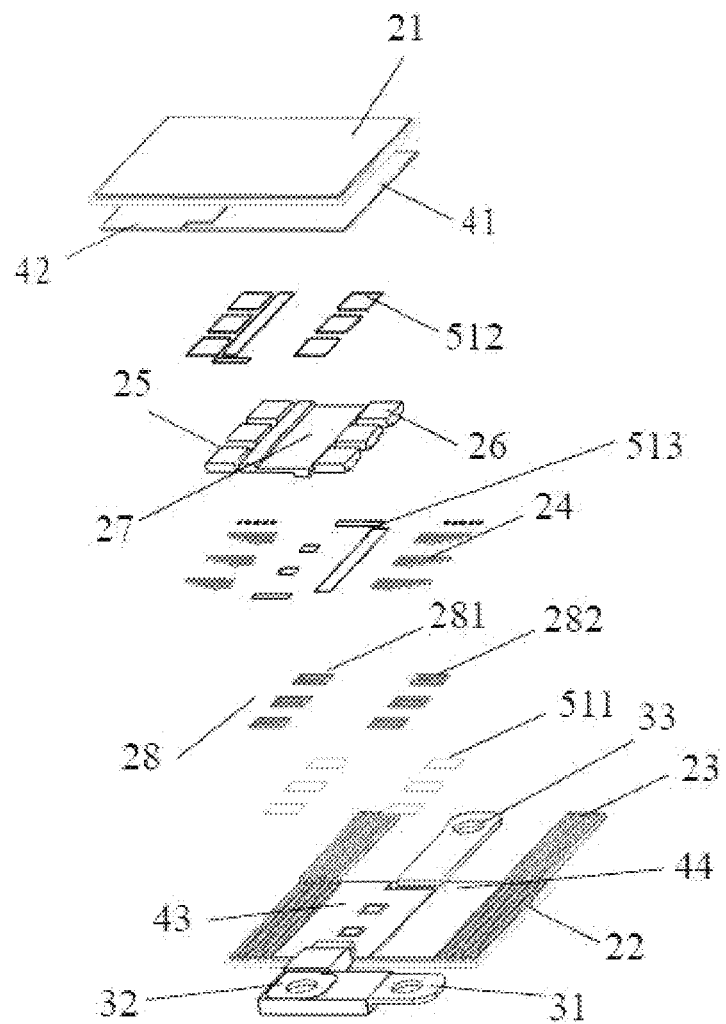
FIG. 6 shows a schematic explosion view of a power module structure of the first embodiment of the present disclosure.

As shown in FIG. 6, a projection, projected on the first reference plane or projected on the second reference plane, of the connecting bridge 27 is overlapped with the first overlapping area. Moreover, in some embodiments, at least a portion of the projection of the connecting bridge 27 is within the coverage of the first overlapping area. The first end of the first switch 281 is connected to the third metal layer 43 by a connecting material. The second end of the first switch 281 is connected to the second metal layer 42 via the first spacer 25. The fourth end of the second switch 282 is connected to the first metal layer 41 via the second spacer 26. The third end of the second switch 282 is connected to the fourth metal layer 44 by a connecting material. Moreover, along the vertical direction, only the third metal layer 43 is below the first switch 281 and only the second metal layer 42 is above the first switch 281. And only a first metal layer 41 is above the second switch 282, and only a fourth metal layer 44 is below the second switch 282, each power device 28 has only one power electrode located above and below the power device 28 alone the vertical direction. Therefore, there is no power electrodes stacked above and below the power device. The projection of the first metal layer 41 and the projection of the third metal layer 43 are overlapped on the first reference plane or on the second reference plane to form a first overlapping area that is the projection of the first metal layer 41 is at least partially overlapped with the projection of the third metal layer 43. The direction of the current flowing through the first metal layer 41 is opposite to the direction of the current flowing through the third metal layer 43.

Figure 5:
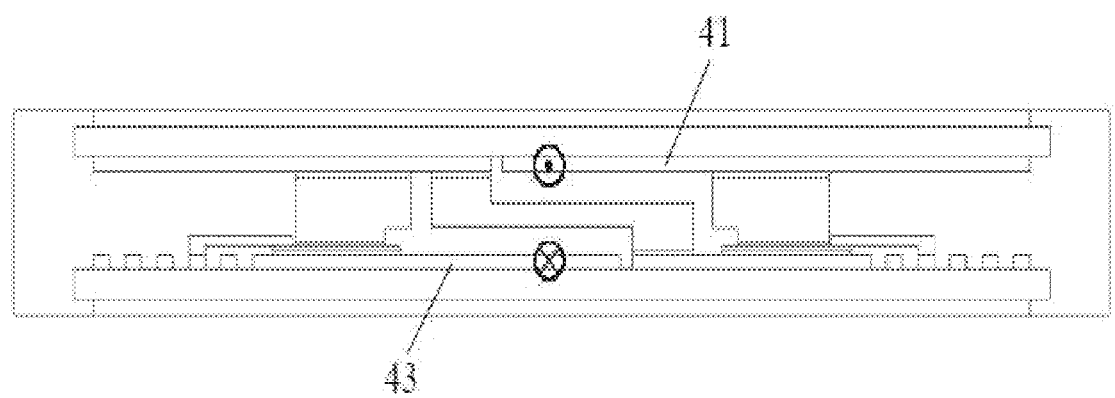
FIG. 5 shows a schematic view of the current direction of the packaged power module structure in FIG. 4.

As shown in FIG. 5, the opposite direction of the current here means that there is that at least a third reference plane is perpendicular to the first reference plane or the second reference plane. The third reference plane vertically cuts the first overlapping area of the third metal layer 43 and the first metal layer 41. The current flowing through the third metal layer 43 and the current flowing through the first metal layer 41 pass through the third reference plane in the opposite direction. The stray inductance of the power module is then reduced since the third metal layer 43 and the first metal layer 41 of the power module are at least partially overlapped and the currents flowing in opposite directions. Moreover, on the upper and lower surfaces of the power device 28, there is a heat dissipation channel that exchanges heat with the environment, which can achieve the goal of double-sided heat dissipation.

Figure 3:
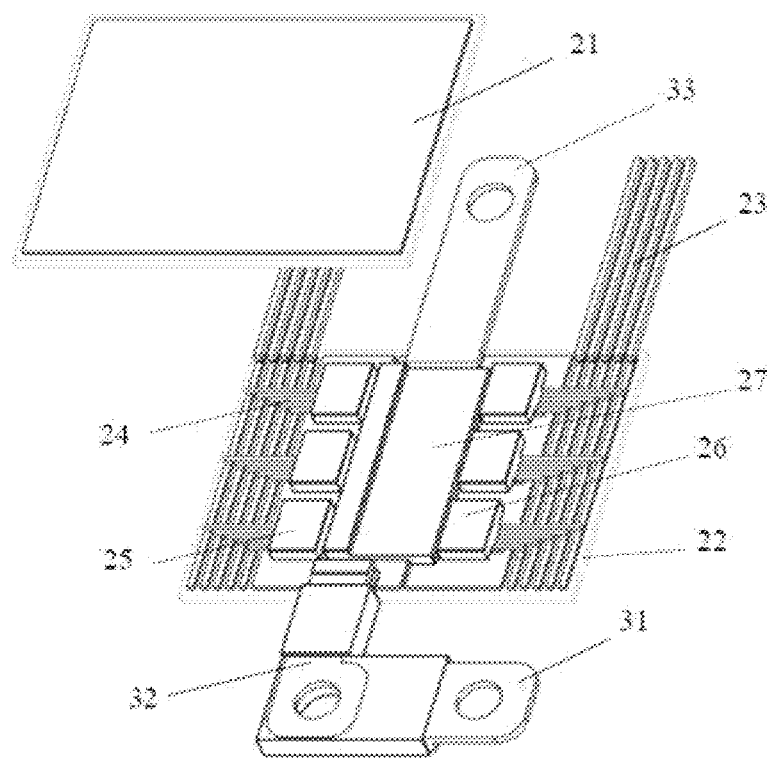
FIG. 3 shows a schematic view of a power module structure of the first embodiment of the present disclosure.

As shown in FIG. 3 to FIG. 5, in this embodiment, at least a portion of the first overlapping area is located between a projection, projected on the first reference plane, of a first switch area and a projection, projected on the first reference plane, of a second switch area. The first switch area is the smallest envelop area of the first switches 281. The second switch area is the smallest envelop area of the second switches 282. As shown in FIG. 4, the smallest envelope area of the first switch 281 is located at the left side of the first overlapping area, and the smallest envelope area of the second switch 282 is located at the right side of the first overlapping area.

Therefore, there are vacant spaces on both sides of the first switch area and the second switch area. The vacant spaces serve as the lead-out areas of the signal terminals of the first switch 281 and the second switch 282. In some embodiments, the first switch 281 is connected to the first signal terminal and the second switch 282 is connected to the second signal terminal. The first switch area and the second switch area are respectively located on two sides of the first overlapping area, and the wire lead-out direction of the first signal terminal and the wire lead-out direction of the second signal terminal are respectively away from the first overlapping area.

As shown in FIG. 4, the wiring lead-out direction of the first signal terminal is extended from the first switch 281 to the left side, and the wiring lead-out direction of the second signal terminal is extended from the second switch 282 to the right side. With this configuration, the chip driving circuits of the first switch 281 is as the same as the chip driving circuits of the second switch 282. Therefore, the driving voltage of each chip is then the same. The chips are synchronized with the switches and the dynamic average current of the chips is then optimized.

In this embodiment, the first switches 281 are linearly disposed along a first direction and the second switches 282 are linearly disposed along the first direction. The first power terminal 31 and the second power terminal 32 are led out in the first direction, and the third power terminal 33 is led out in a direction which is opposite to the first direction. With this configuration, the wire lead-out direction of the first power terminal 31, the second power terminal 32 and the third power terminal 33 do not respectively occupy the vacant spaces on both sides of the first switch area and the second switch area. Therefore, the vacant space on the left side of the first switch 281 is used for the wire lead-out area of the signal terminal of the first switch 281. The vacant space on the right side of the second switch 282 is used for the wire lead-out area of the signal terminal of the second switch 282. With this configuration, the chip driving circuits of the first switch 281 is as the same as the chip driving circuits of the second switch 282. Therefore, the driving voltage of each chip is then the same. The chips are synchronized with the switches and the dynamic average current of the chips is then optimized.

As shown in FIG. 6, in this embodiment, the first substrate 21 and the second substrate 22 respectively includes a composite substrate including an insulating layer and an outer metal layer. In some embodiments, the first substrate 21 and the second substrate 22 respectively includes an insulating substrate including an insulating layer only. The first metal layer 41, the second metal layer 42, the third metal layer 43 and the fourth metal layer 44 are all disposed on the inner side of the substrate.

In some embodiments, the power module structure does not include the substrate. Therefore, the metal layer of the power module includes a wire lead frame, such that the material for the power module structure is then saved.

The power component 28 is connected to the metal layer disposed on the inner side of the second substrate 22 by the connecting material 511. The connecting material 511 includes solder, sintered silver or conductive silver paste.

The power device 28 is connected to the metal layer disposed on the inner side of the first substrate 21 via the first spacer 25, the second spacer 26, and the connecting material 512. The first spacer 25 and the second spacer 26 are both thermal and electrical conductors. Furthermore, in some embodiments, the material of the first spacer 25 and the second spacer 26 includes copper, aluminum, molybdenum, tungsten, copper tungsten alloy or copper molybdenum alloy.

The connecting bridge 27 is respectively connected to the second metal layer 42 and the fourth metal layer 44 by a connecting material 513. Meanwhile, by adjusting the thicknesses of the first spacer 25 and the second spacer 26, the distance between the first substrate 21 and the second substrate 22 in the power module is adjusted. Therefore, the distance between the third metal layer 43 and the first metal layer 41 is adjustable. The size of the power module is adjustable and the stray inductance of the power module is adjustable as well. The above structure is merely an example embodiment, and in other embodiments, the power module structure may have many variations. For example, the positions of the first switch 281 and the first spacer 25 are interchangeable. The positions of the second switch 282 and the second spacer 26 are interchangeable. It should be understood that, in this embodiment, "inside of the substrate" herein refers to the side of the substrate close to the switch, such as the lower side of the first substrate 21 shown in FIG. 6 and the upper side of the second substrate 22.

In this embodiment, the first switch 281 and the second switch 282 are vertical devices, e.g. IGBT (Insulated Gate Bipolar Transistor), MOSFET or diode.

The signal terminal 23 is connected to the signal end of the power component 28 connected, via the bonding wires 24 and the metal layer disposed on the inner side of the second substrate 22. Moreover, in some embodiments, the signal terminal 23 is connected to the signal end of the power component 28 connected, via the bonding wires 24, a PCB disposed on the outside of the power component 28 and the metal layer disposed on the inner side of the second substrate 22. The first power terminal 31 is electrically connected to the first switch 281 via the third metal layer 43 disposed on the inner side of the second substrate 22, and the second power terminal 32 is electrically connected, via the first metal layer 41 disposed on the inner side of the first substrate 21, to the second switch 282. The first switch 281 and the second switch 282 are electrically connected via the connecting bridge 27. The third power terminal 33 is connected to the connecting bridge 27 via the fourth metal layer 44 disposed on the inner side of the second substrate 22. In some embodiments, the third power terminal 33 is directly connected to the connecting bridge 27. In some embodiments, the third power terminal 33 is integrated with the connecting bridge 27. The projections of the first power terminal 31 and the second power terminal 32 on the first reference plane or the second reference plane are at least partially overlapped. Therefore, the stray inductance of the power module is then reduced. In this embodiment, the connecting bridge 27 is located between the first switch 281 and the second switch 282 and the stray inductance of the power module is further reduced. The material of the bridge 27 includes metal materials. The metal materials include copper, aluminum, molybdenum, tungsten, copper tungsten alloy or copper molybdenum alloy.

Figure 7:
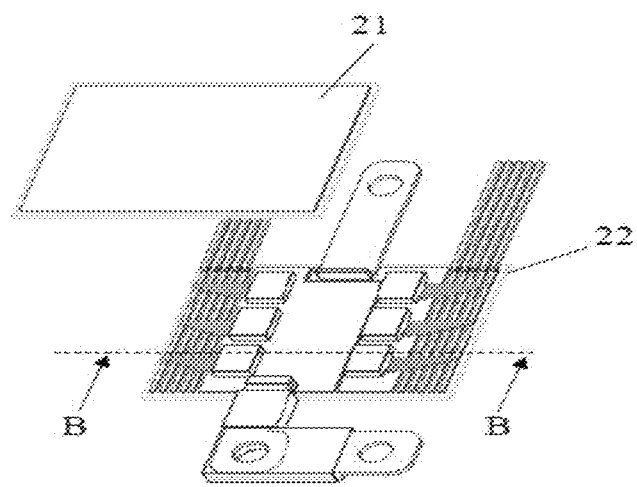
FIG. 7 shows a schematic view of a power module structure of a second embodiment of the present disclosure.
Figure 8:
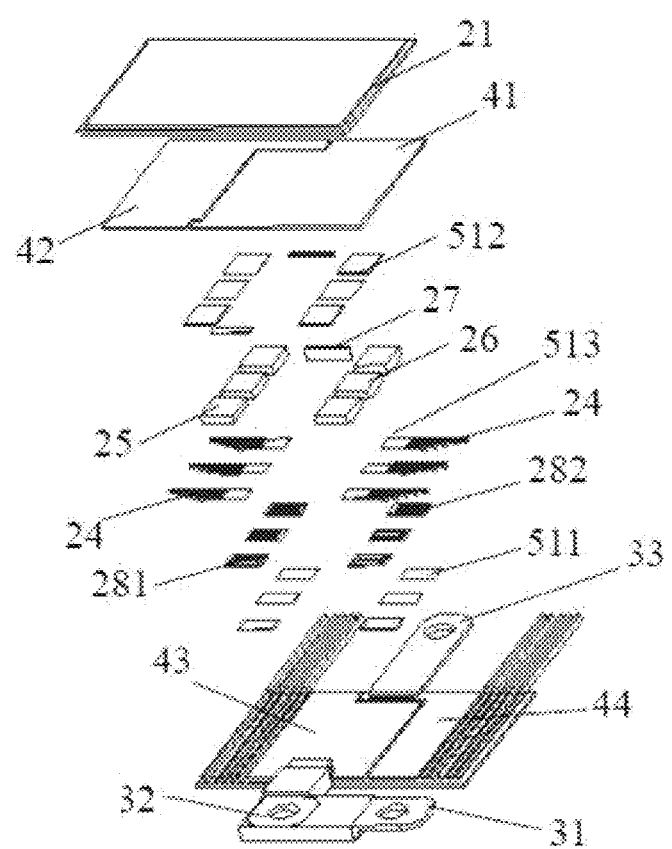
FIG. 8 shows a schematic explosion view of a power module structure of the second embodiment of the present disclosure.
Figure 9:
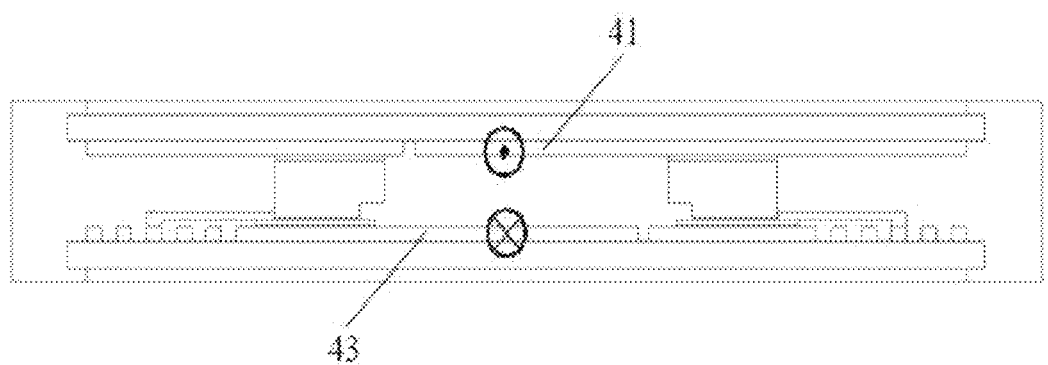
FIG. 9 shows a schematic cross-sectional view alone BB line of the packaged power module structure in FIG. 7.

FIG. 7 to FIG. 9 shows a power module structure of a second embodiment of the present disclosure. The power module structure of the second embodiment is similar to the power module structure of the first embodiment. The first switch 281 is connected, via the connecting bridge 27, to the second switch 282. However, in the second embodiment, the connecting bridge is centrally disposed on the same side of the first switch 281 and the second switch 282. In this embodiment, three pairs of power devices arranged side by side in two columns. The first switch 281 of each pair is arranged in the first column. The second switch 282 is arranged in the second column parallel to the first column. The two power devices of each pair are correspondingly arranged left and right. The connecting bridge 27 is located on a symmetry line of the first column and the second column, and is placed outside of all of the power devices 28. Since the connecting bridge 27 is disposed in a local area between or outside of the first switch 281 and the second switch 282, a goal of better current sharing effect is then achieved.

FIG. 9 is a cross-sectional view along line BB of the power module structure of FIG. 7. The power device 28 includes only one power electrode on the upper and the lower sides of the power device 28 in a vertical direction. The projections, projected on the first reference plane or the second reference plane, of the third metal layer 43 and the first metal layer 41 in the module are overlapped to form the first overlapping area. The direction of the current flowing through the first metal layer 41 is opposite to the direction of the current flowing through the third metal layer 43. Therefore, the stray inductance of the power module is then reduced as well.

Figure 10:
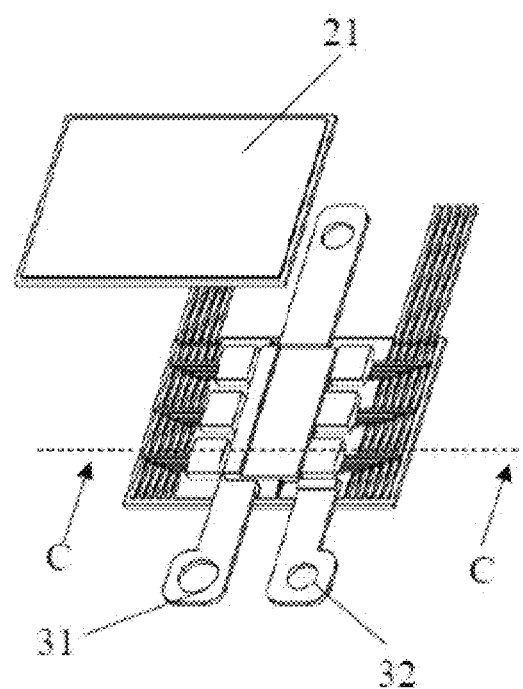
FIG. 10 shows a schematic view of a power module structure of a third embodiment of the present disclosure.
Figure 11:
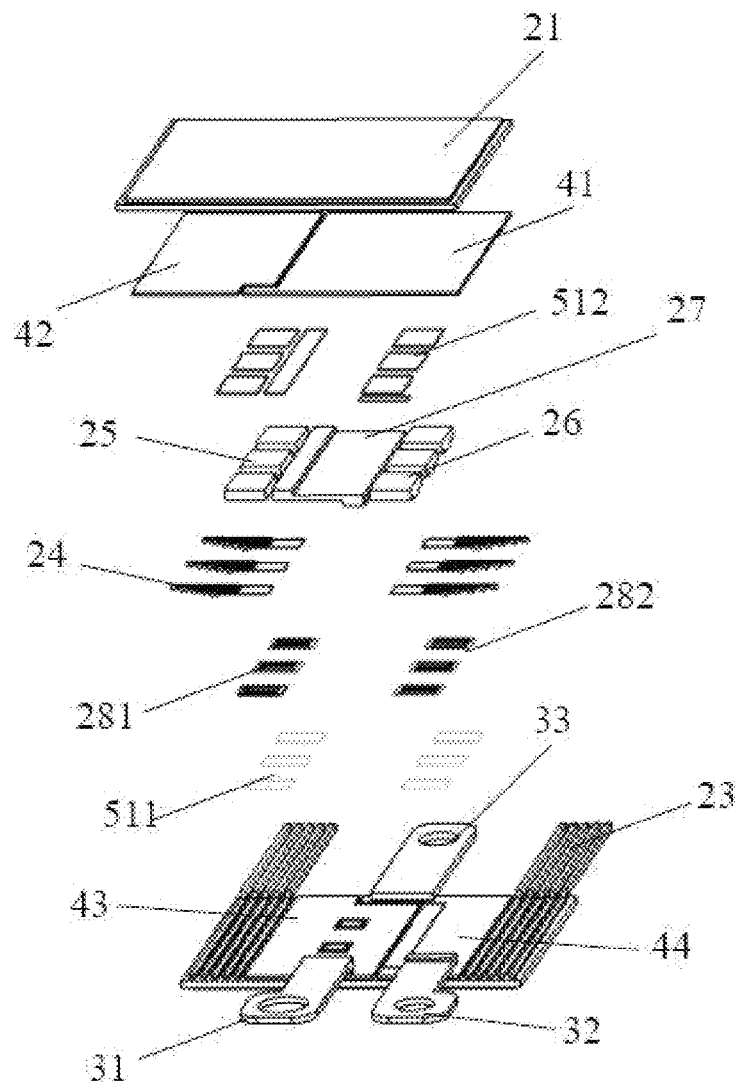
FIG. 11 shows a schematic explosion view of a power module structure of the third embodiment of the present disclosure.

FIG. 10 to FIG. 11 shows a schematic view of a power module structure of a third embodiment of the present disclosure. The power module structure of the third embodiment is similar to the power module structure of the first embodiment but a projection, projected on the first reference plane or on the second reference plane, of the first power terminal 31 and the second power terminal 32 are not overlapped. In this embodiment, the power device 28 includes only one power electrode on the upper and the lower sides of the power device 28 in a vertical direction. The projections, projected on the first reference plane or the second reference plane, of the third metal layer 43 and the first metal layer 41 in the module are overlapped to form the first overlapping area. The direction of the current flowing through the first metal layer 41 is opposite to the direction of the current flowing through the third metal layer 43. Therefore, the stray inductance of the power module is then reduced as well.

Figure 12:
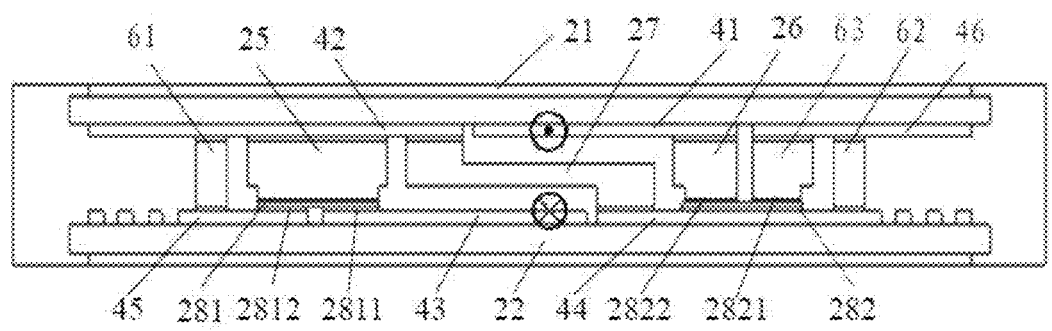
FIG. 12 shows a schematic view of a power module structure of a fourth embodiment of the present disclosure.

FIG. 12 shows a schematic view of a power module structure of a fourth embodiment of the present disclosure. The power module structure of the fourth embodiment is similar to the power module structure of the first embodiment, but the first switches 281 and the second switches 282 of FIG. 12 are flat components, e.g. GaN component. A power electrode of the power component is led out from a side of the power component. The side with led-out electrode is an electrode containing layer. The other side of the power component is an electrode non-containing layer. The first switches 281 and the second switches are connected to the same substrate. In some embodiments, the electrode non-containing layer of the power component 28 is connected to the substrate. In some embodiments, the electrode containing layer of the power component 28 is connected to the substrate. As shown in FIG. 12, the electrode containing layer of the power component 28 is connected to the lower substrate 22.

In this embodiment, the power module structure further includes a third spacer 63, a first connecting column 61 and a second connecting column 62. In this embodiment, a first end 2811 of the first switch 281 is connected to the third metal layer 43. A second end 2812 of the first switch 281 is connected to the first connection metal layer 45. The first connection metal layer 45 is disposed on the second reference plane and adjacent to the third metal layer 43. The first connecting column 61 is connected between the first connection metal layer 45 and the second metal layer 42. A third end 2821 of the second switch 282 is connected to the third spacer 63. The third spacer 63 is connected to the second connecting metal layer 46. The second connecting metal layer 46 is disposed on the first reference plane and adjacent to the first metal layer 41.

The second connecting column 62 is respectively connected to the second connecting metal layer 46 and the fourth metal layer 44. A fourth end 2822 of the second switch 282 is connected to the second spacer 26. The second spacer 26 is connected to the first metal layer 41.

In this embodiment, the first spacer 25 is a metal spacer or a spacer with thermal insulation material. The second spacer 26 and the third spacer 63 both are metal spacers. The thermal insulation material includes Aluminum Oxide, Beryllium Oxide, Aluminum Nitride, and DBC (Direct Bonding Copper). The power device 28 includes only one power electrode on the upper and the lower sides of the power device 28 in a vertical direction. The projections, projected on the first reference plane or the second reference plane, of the third metal layer 43 and the first metal layer 41 in the module are overlapped to form the first overlapping area. The direction of the current flowing through the first metal layer 41 is opposite to the direction of the current flowing through the third metal layer 43. Therefore, the stray inductance of the power module is then reduced as well.

Figure 13:
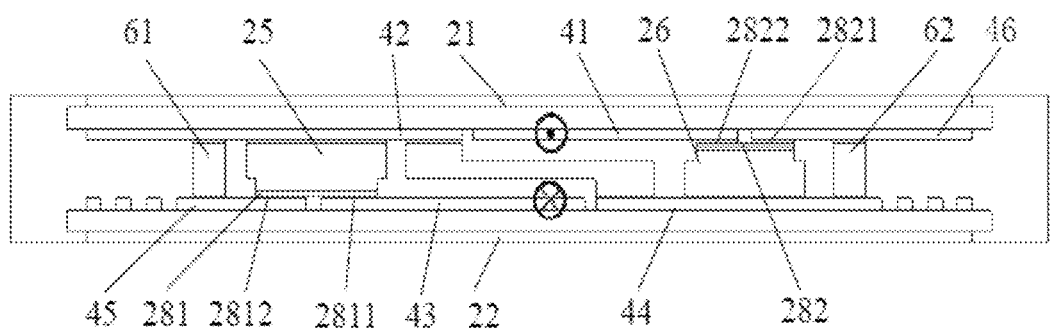
FIG. 13 shows a schematic view of a power module structure of a fifth embodiment of the present disclosure.

FIG. 13 shows a schematic view of a power module structure of a fifth embodiment of the present disclosure. The power module structure of the fifth embodiment is similar to the power module structure of the fourth embodiment. The first switch 281 and the second switch 282 are both flat components but, as shown in FIG. 13, the first switch 281 and the second switch 282 are respectively disposed on the second substrate 22 and the first substrate 21. In this embodiment, the first switch 281, including the electrode containing layer, is disposed on the second substrate 22 and connected to the metal layer of the inner side of the second substrate 22. The second switch 282, including the electrode containing layer, is disposed on the first substrate 21 and connected to the metal layer of the inner side of the first substrate 21. The present disclosure is not limited thereto.

In this embodiment, the power module structure further includes the first connecting column 61 and the second connecting column 62. In this embodiment, the first end 2811 of the first switch 281 is connected to the third metal layer 43. The second end 2812 of the first switch 281 is connected to the first connection metal layer 45. The first connection metal layer 45 is disposed on the second reference plane and adjacent to the third metal layer 43. The first connecting column 61 is connected between the first connection metal layer 45 and the second metal layer 42. The third end 2821 of the second switch 282 is connected to the second connection metal layer 46. The second connection metal layer 46 is disposed on the first reference plane and adjacent to the first metal layer 41. The second connecting column 62 is respectively connected to the second connecting metal layer 46 and the fourth metal layer 44. The fourth end 2822 of the second switch 282 is connected to the first metal layer 41.

In this embodiment, the first spacer 25 is a metal spacer or a spacer with thermal insulation material. The second spacer 26 is a metal spacer or a spacer with thermal insulation material. The power device 28 includes only one power electrode on the upper and the lower sides of the power device 28 in a vertical direction. The projections, projected on the first reference plane or the second reference plane, of the third metal layer 43 and the first metal layer 41 in the module are overlapped to form the first overlapping area. The direction of the current flowing through the first metal layer 41 is opposite to the direction of the current flowing through the third metal layer 43. Therefore, the stray inductance of the power module is then reduced as well.

Figure 14:
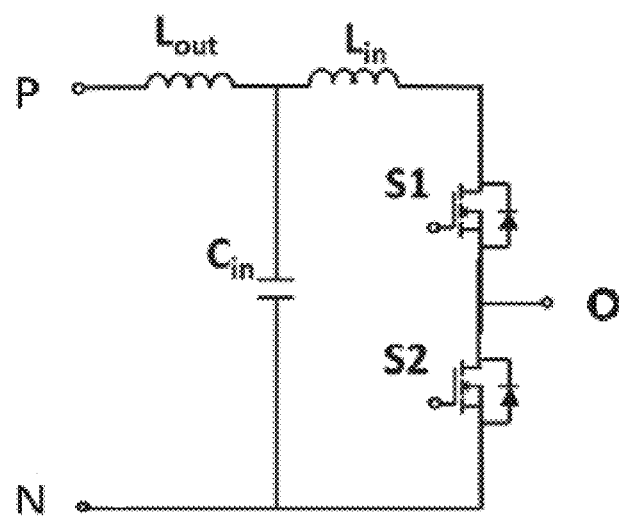
FIG. 14 shows a schematic view of equivalent circuits of a half-bridge module including clamping capacitors.

FIG. 14 shows a schematic view of equivalent circuits of a half-bridge module including clamping capacitors. In this embodiment, the power module structure includes a clamping capacitor $C_{in}$ which will reduce an area of high frequency circuits when the component is turned off. Moreover, the stray inductance of the high frequency circuits is then reduced as well. For example, when the power module does not include the clamping capacitor $C_{in}$, the stray inductance of the high frequency circuits is $L_{out}+L_{in}$. When the power module includes the clamping capacitor $C_{in}$, the stray inductance of the high frequency circuits is $L_{in}$, which means the inductance of the power module becomes small.

Figure 15:
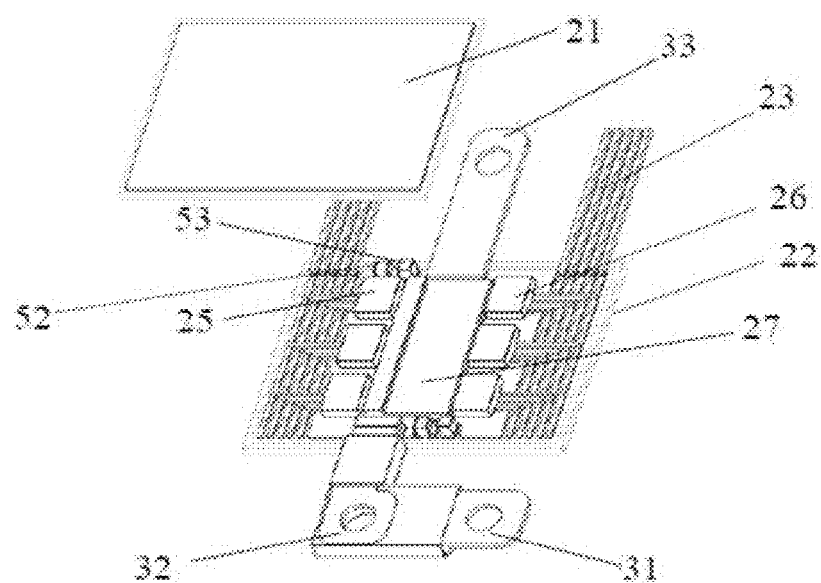
FIG. 15 shows a schematic view of a power module structure of a sixth embodiment of the present disclosure.

FIG. 15 shows a schematic view of a power module structure of a sixth embodiment of the present disclosure. The power module structure of the sixth embodiment is similar to the power module structure of the first embodiment but further includes a clamping capacitor 52. The clamping capacitor 52 is disposed between the first reference plane and the second reference plane and is electrically connected between the third metal layer 43 and the first metal layer 41.

In this embodiment, the clamping capacitor 52 is a flat clamping capacitor. The power module structure further includes a capacitor connecting spacer 53, wherein the clamping capacitor 52 and the capacitor connecting spacer 53 are located at outside of the connecting bridge 27. A end of the clamping capacitor 52 is electrically connected to the third metal layer 43 and the other end of the clamping capacitor 52 is electrically connected, via the capacitor connecting spacer 53, to the first metal layer 41. The power device 28 includes only one power electrode on the upper and the lower sides of the power device 28 in a vertical direction. The projections, projected on the first reference plane or the second reference plane, of the third metal layer 43 and the first metal layer 41 in the module are overlapped to form the first overlapping area. The direction of the current flowing through the first metal layer 41 is opposite to the direction of the current flowing through the third metal layer 43. Therefore, the stray inductance of the power module is then reduced as well. Therefore, in this embodiment, since the power module structure includes the clamping capacitor 52 located between the P pole and the N pole, the stray inductance of the power module is then reduced.

Figure 16:
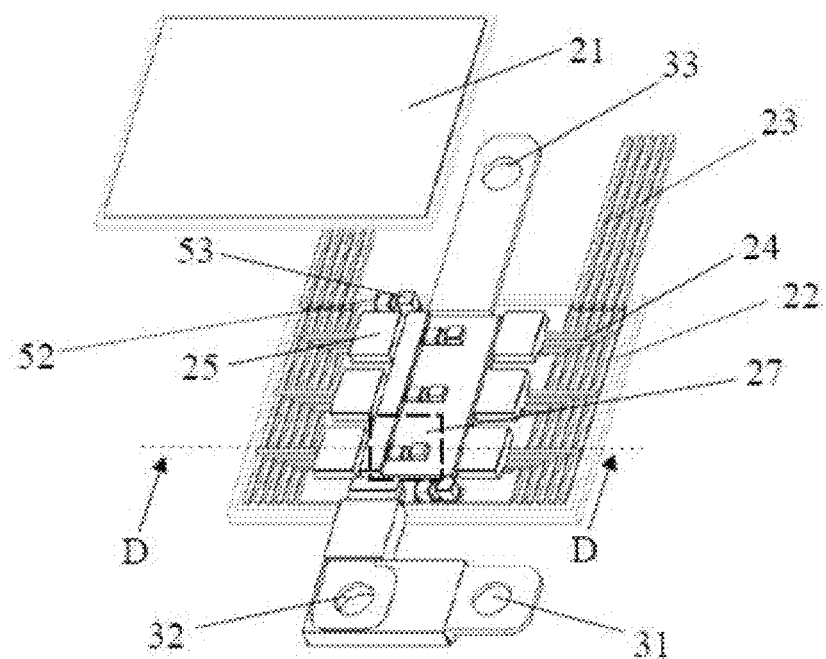
FIG. 16 shows a schematic view of a power module structure of a seventh embodiment of the present disclosure.
Figure 17:
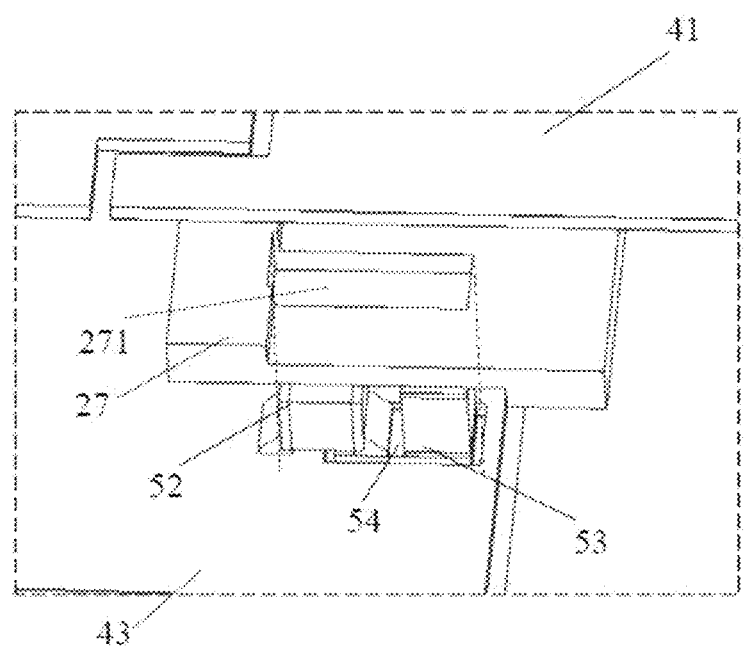
FIG. 17 shows an enlarged schematic view of a square area in FIG. 16.
Figure 18:
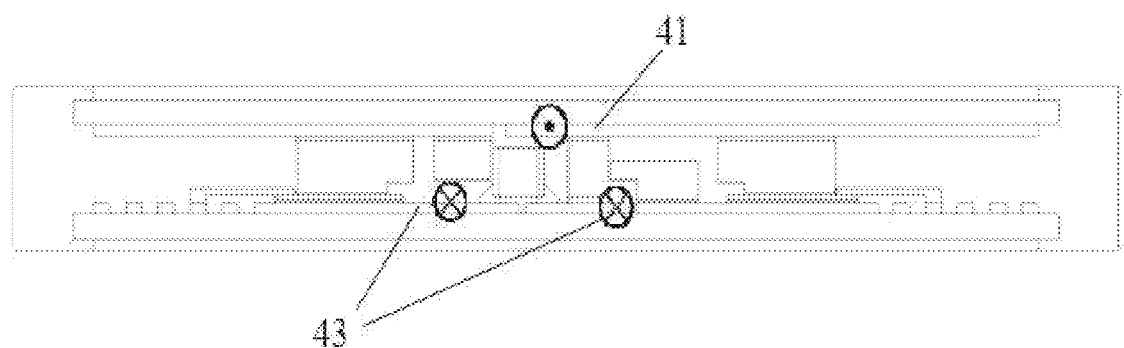
FIG. 18 shows a schematic cross-sectional view alone DD line of the power module structure in FIG. 16.

FIG. 16 to FIG. 18 shows a schematic view of a power module structure of a seventh embodiment of the present disclosure. The power module structure of the seventh embodiment is similar to the power module structure of the sixth embodiment. The power module structure, in this embodiment, the power module structure includes the clamping capacitor 52 and the capacitor connecting bridge 53. The clamping capacitor is a flat clamping capacitor. However, in this embodiment, except the clamping capacitor 52 disposed on the outside of the connecting bridge 27, the connecting bridge 27 further includes a hollow portion 271 for receiving the clamping capacitor 52 and the capacitor connecting spacer 53. In this embodiment, a end of the clamping capacitor 52 is electrically connected, via the connecting material, to the third metal layer 43 and the other end of the clamping capacitor 52 is electrically connected, via the third connecting metal layer 54, the capacitor connecting spacer 53 disposed on the third connecting metal layer 54 and the connecting material, to the first metal layer 41. Compared with the power module structure of the sixth embodiment, since the power module structure of the seventh embodiment includes clamping capacitor 52 disposed in the hollow portion 271 and at outside of the bridge 27, an area of high frequency circuits will be reduced and the inductance of the high frequency circuits is reduced as well.

FIG. 18 shows a schematic cross-sectional view alone DD line of the power module structure in FIG. 16. The power device 28 includes only one power electrode on the upper and the lower sides of the power device 28 in a vertical direction. The projections, projected on the first reference plane or the second reference plane, of the third metal layer 43 and the first metal layer 41 in the module are overlapped to form the first overlapping area. The direction of the current flowing through the first metal layer 41 is opposite to the direction of the current flowing through the third metal layer 43. Therefore, the stray inductance of the power module is then reduced as well. Therefore, in this embodiment, since the power module structure includes the clamping capacitor 52 located between the P pole and the N pole, the stray inductance of the power module is then reduced.

Figure 19:
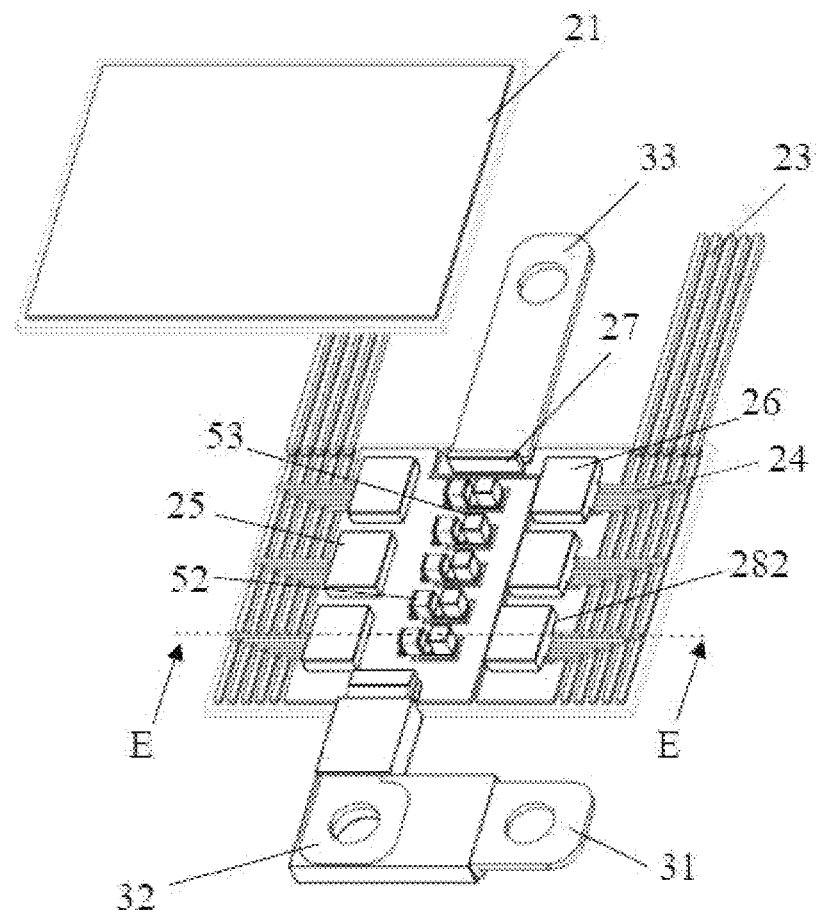
FIG. 19 shows a schematic view of a power module structure of a eighth embodiment of the present disclosure.
Figure 20:
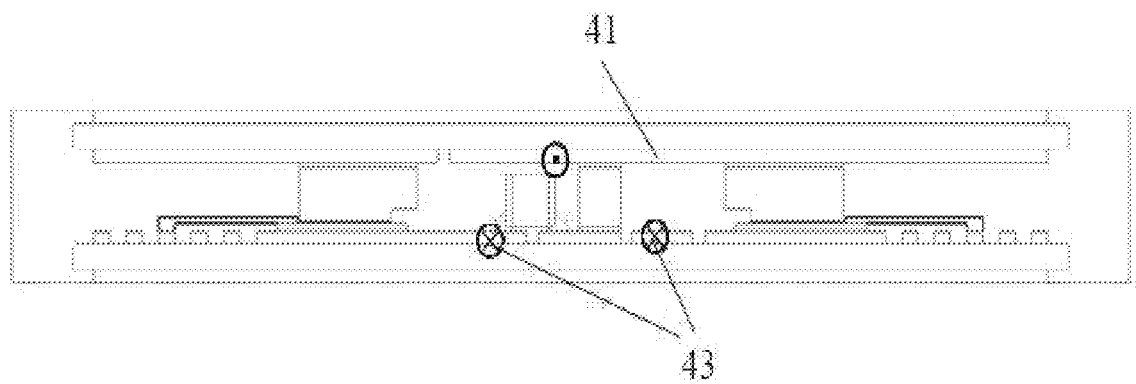
FIG. 20 shows a schematic cross-sectional view alone EE line of the power module structure in FIG. 19.

FIG. 19 to FIG. 20 shows a schematic view of a power module structure of a eighth embodiment of the present disclosure. The eighth embodiment is similar to the second embodiment. The connecting bridge 27 is disposed on the same side of the first switch 281 and the second switch 282. In this embodiment, the power module structure further includes the clamping capacitors 52 and the capacitor connecting spacers 53. The clamping capacitor 52 is a flat clamping capacitor. Except the location of the connecting bridge 27, the clamping capacitors 52 and the capacitor connecting spacers 53 are located between the first switch 281 and the second switch 282. In this embodiment, a end of the clamping capacitor 52 is electrically connected, via the connecting material, to the third metal layer 43 and the other end of the clamping capacitor 52 is electrically connected, via the connecting material and the capacitor connecting spacer 53, to the first metal layer 41.

FIG. 20 shows a schematic cross-sectional view alone EE line of the power module structure in FIG. 19. The power device 28 includes only one power electrode on the upper and the lower sides of the power device 28 in a vertical direction. Therefore, the stray inductance of the power module is then reduced as well. Therefore, in this embodiment, since the power module structure includes the clamping capacitor 52 located between the P pole and the N pole, the stray inductance of the power module is then reduced.

Figure 21:
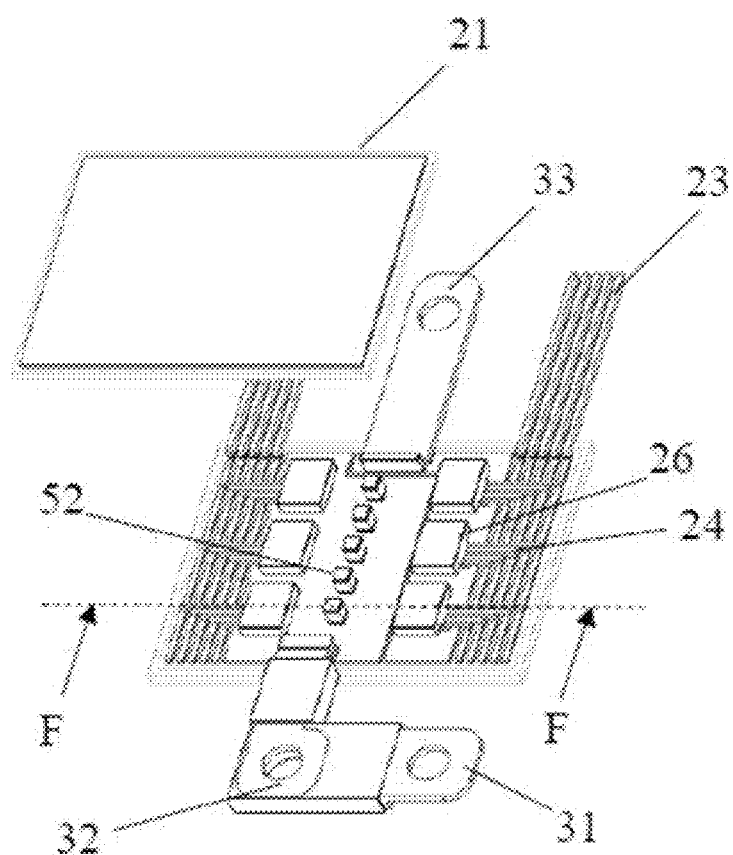
FIG. 21 shows a schematic view of a power module structure of a ninth embodiment of the present disclosure.
Figure 22:
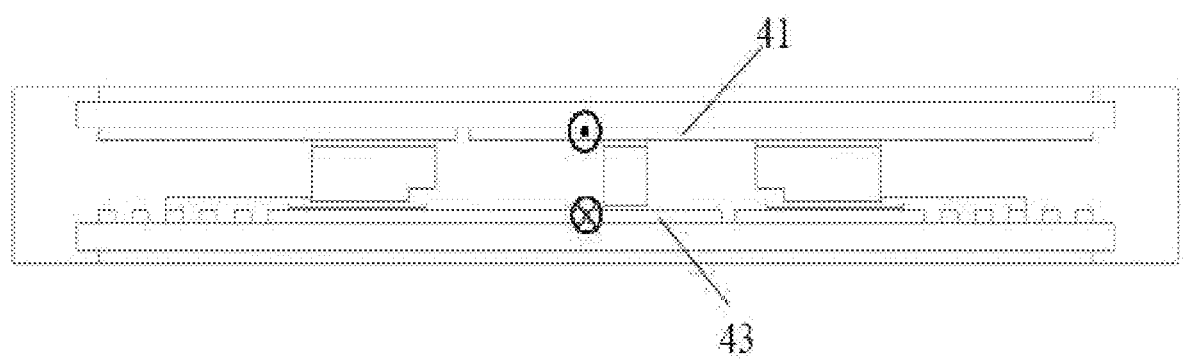
FIG. 22 shows a schematic cross-sectional view alone FF line of the power module structure in FIG. 21.

FIG. 21 to FIG. 22 shows a schematic view of a power module structure of a ninth embodiment of the present disclosure. The ninth embodiment is similar to the second embodiment. The connecting bridge 27 is disposed on the same side of the first switch 281 and the second switch 282. In this embodiment, the power module structure further includes the clamping capacitors 52, wherein the clamping capacitor 52 is an upright clamping capacitor. In this embodiment, except the location of the connecting bridge 27, the clamping capacitors 52 located between the first switch 281 and the second switch 282. In this embodiment, a end of the clamping capacitor 52 is electrically connected, via the connecting material, to the third metal layer 43 and the other end of the clamping capacitor 52 is electrically connected, via the connecting material, to the first metal layer 41.

FIG. 22 shows a schematic cross-sectional view alone FF line of the power module structure in FIG. 21. The power device 28 includes only one power electrode on the upper and the lower sides of the power device 28 in a vertical direction. Therefore, the stray inductance of the power module is then reduced as well. Therefore, in this embodiment, since the power module structure includes the clamping capacitor 52 located between the P pole and the N pole, the stray inductance of the power module is then reduced.

Figure 23:
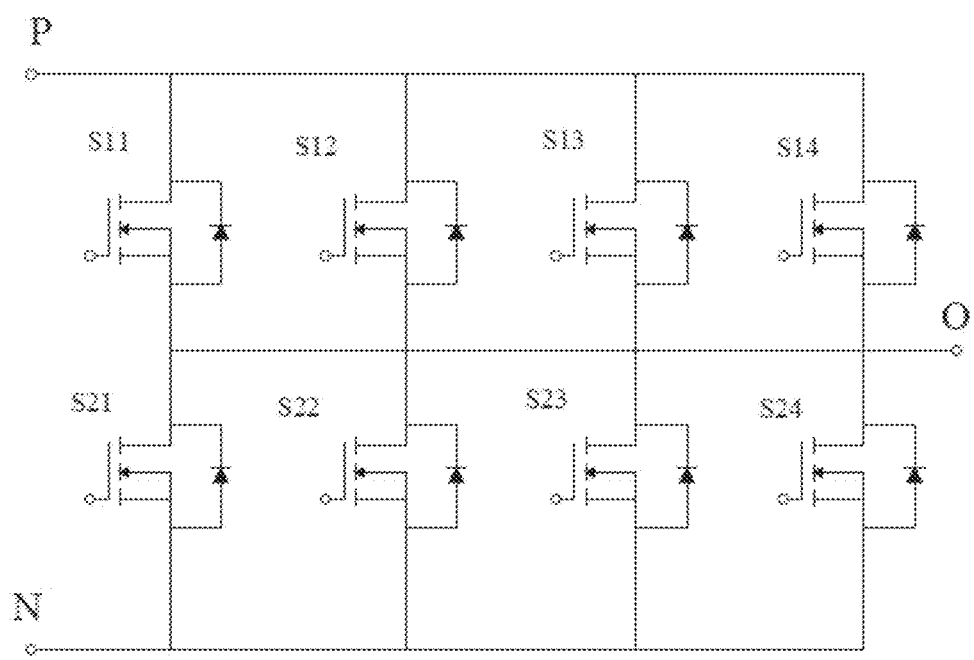
FIG. 23 shows a schematic view of equivalent circuits of a half-bridge module including four pair switches.
Figure 24:
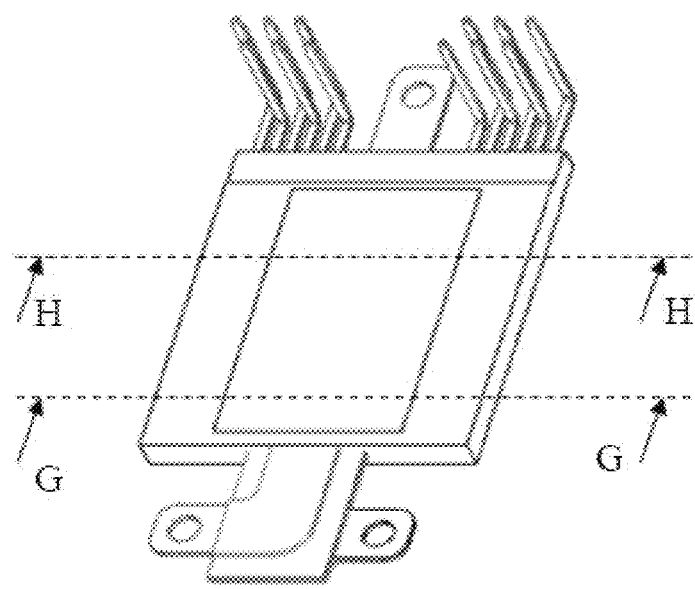
FIG. 24 shows a schematic view of a power module structure of a tenth embodiment of the present disclosure.
Figure 27:
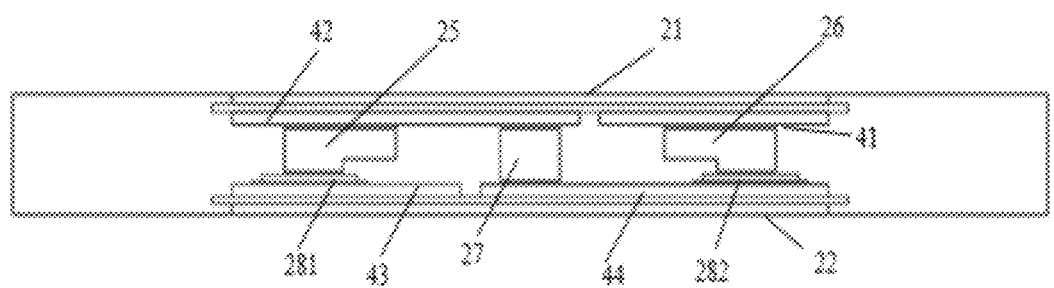
FIG. 27 shows a schematic cross-sectional view alone HH line of the power module structure in FIG. 24.
Figure 28:
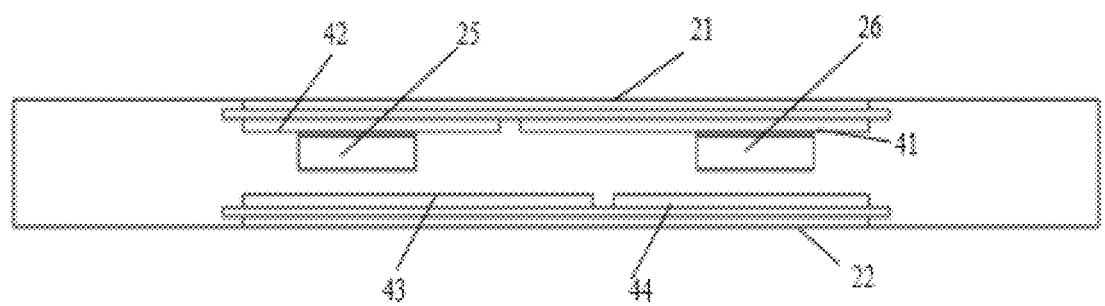
FIG. 28 shows a schematic cross-sectional view alone GG line of the power module structure in FIG. 24.

FIG. 23 to FIG. 30 shows a schematic view of a power module structure of a tenth embodiment of the present disclosure. FIG. 23 shows a schematic view of equivalent circuits of a half-bridge module including four pair switches. The switches S11, S12, S13 and S14 are respectively presented as the first switch 281. The switches S21, S22, S23 and S24 are respectively presented as the second switch 282. In the tenth embodiment, the projection of the first metal layer 41 and the projection of the third metal layer 43 are overlapped on the first reference plane or on the second reference plane to form a first overlapping area. The projection of the second metal layer 42 and the projection of the fourth metal layer 44 are overlapped on the first reference plane or on the second reference plane to form a second overlapping area. Moreover, the projection, projected on the first reference plane or the second reference plane, of the first bridge 27 is within the coverage of the second overlapping area. Therefore, in this embodiment, the connecting bridge 27 is not necessary to be designed as an irregular shape like the connecting bridge of the first embodiment. As shown in FIG. 27, in this embodiment, the connecting bridge 27 is a cylindrical connecting bridge. Moreover, the first switch 281 is electrically connected, via the cylindrical connecting bridge 27, to the second switch 282. The third power terminal 33 is connected, via the second substrate 22, to the cylindrical connecting bridge 27. In some embodiments, the third power terminal 33 is directly connected to the cylindrical connecting bridge 27. Compared with the connecting bridge with irregular shape of the first embodiment, in this embodiment, the cylindrical connecting bridge 27 is easier to produce and has higher reliability. The cost of the power module structure is then reduced.

Figure 25:
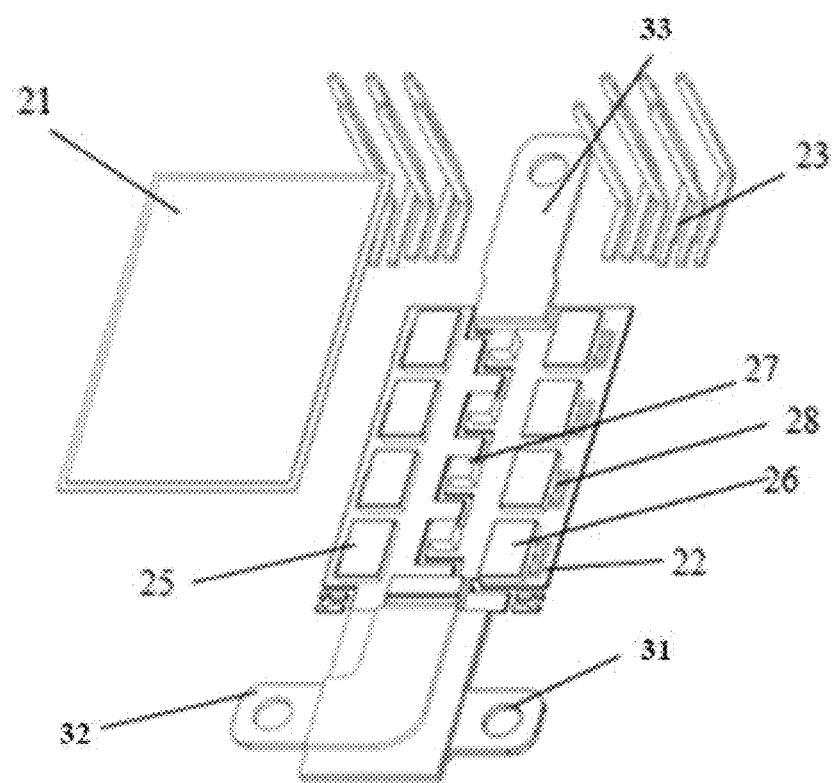
FIG. 25 and FIG. 26 show a schematic explosion view of a portion of the power module structure of FIG. 24.
Figure 26:
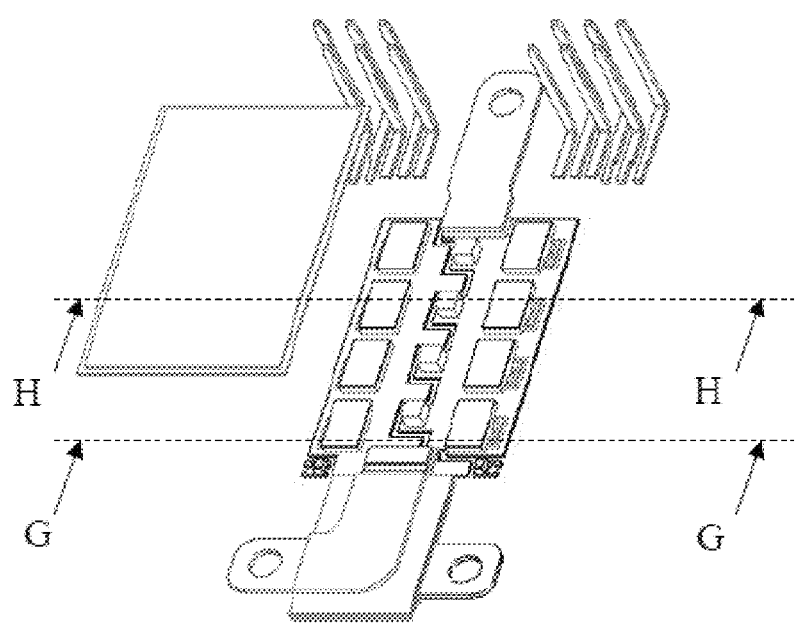

In this embodiment, the projection of the connecting bridge 27, projected on the first reference plane or on the second reference plane, does not overlap with the first overlapping area. Moreover, as shown in FIG. 25, a projection, projected on the first reference plane or projected on the second reference plane, of a connecting area of the first metal layer 41 and the second power terminal 32 is overlapped with a projection, projected on the first reference plane or projected on the second reference plane, of a connecting area of the third metal layer 43 and the first power terminal 31.

Figure 29:
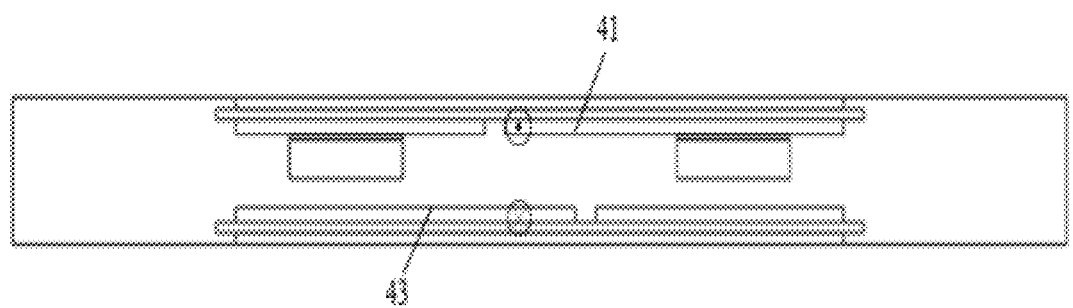
FIG. 29 shows a schematic view of the current direction of the power module structure in FIG. 27.

As shown in FIG. 29, the direction of the current flowing through the first metal layer 41 is opposite to the direction of the current flowing through the third metal layer 43. The stray inductance of the power module is then reduced since the third metal layer 43 and the first metal layer 41 of the power module are at least partially overlapped and the currents flowing in opposite directions.

Figure 30:
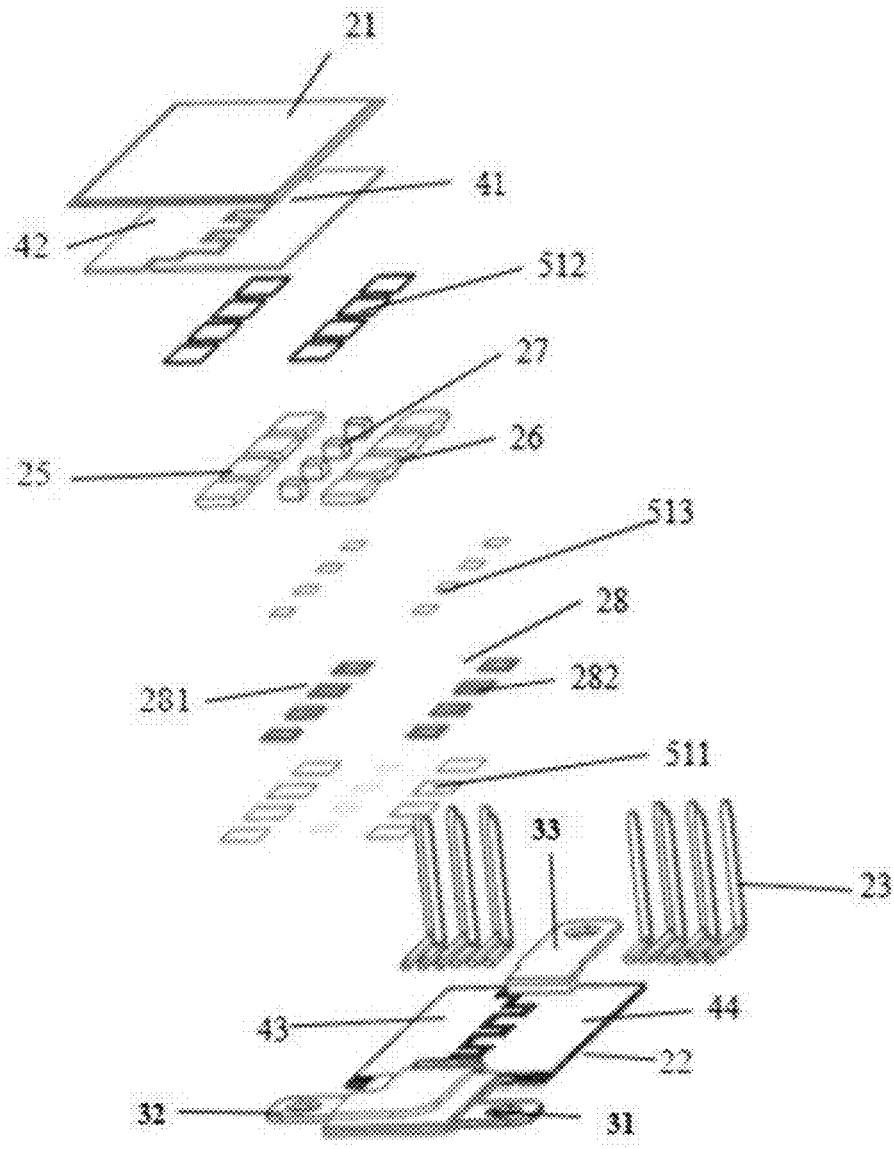
FIG. 30 shows a schematic explosion view of a power module structure of the tenth embodiment of the present disclosure.

In this embodiment, the first overlapping area and the second overlapping area are alternately arranged. As shown in FIG. 30, at a boundary of the first metal layer 41 and the second metal layer 42, an edge of the first metal layer 41 and an edge of the second metal layer 42 are fitting into each other in a zigzag manner to form a zigzag boundary. Moreover, at a boundary of the third metal layer 43 and the fourth metal layer 44, an edge of the third metal layer 43 and an edge of the fourth metal layer 44 are fitting into each other in a zigzag manner to form a zigzag boundary.

In this embodiment, a projection, projected on the first reference plane or on the second reference plane, of the zigzag edge of the first metal layer 41 is overlapped with a projection, projected on the first reference plane or on the second reference plane, of the zigzag edge of the third metal layer 43 to form the first overlapping area. Moreover, a projection, projected on the first reference plane or on the second reference plane, of the zigzag edge of the second metal layer 42 is overlapped with a projection, projected on the first reference plane or on the second reference plane, of the zigzag edge of the fourth metal layer 44 to form the second overlapping area. The quantities and the deployment pattern of the connecting bridge 27 shown in FIG. 30 are not limited thereto. In some embodiments, the cylindrical connecting bridges 27 is evenly deployed between the first switch 281 and the second switch 282 which will reduce more inductance value of the stray inductance. The first overlapping area and the second overlapping area are evenly deployed between the first switch 281 and the second switch 282. In this embodiment, the cylindrical connecting bridge 27 is made of metal materials. The metal material includes copper, aluminum, molybdenum, copper-tungsten alloy or copper-molybdenum alloy.

Figure 31:
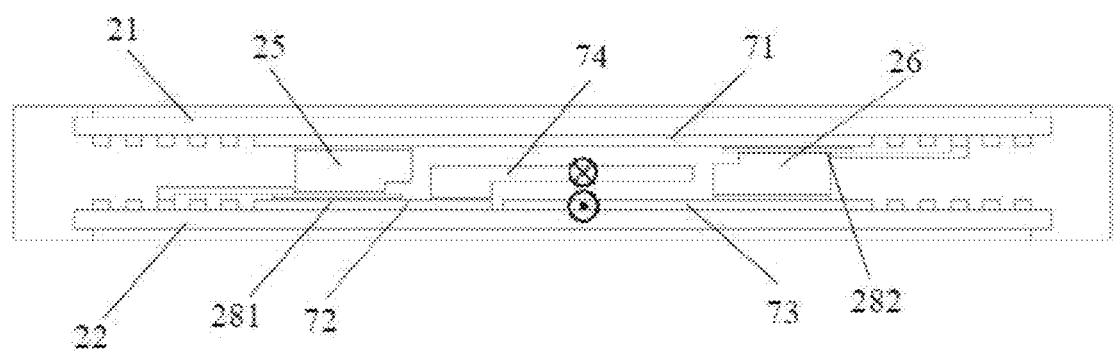
FIG. 31 shows a schematic view of a power module structure of a eleventh embodiment of the present disclosure.
Figure 32:
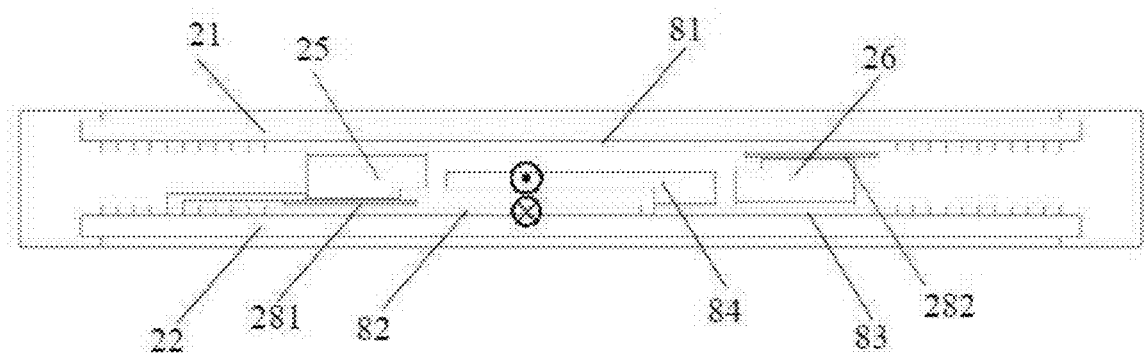
FIG. 32 shows a schematic view of a power module structure of a twelfth embodiment of the present disclosure.

FIG. 31 and FIG. 32 shows a schematic view of the power module structure of the eleventh embodiment and the twelfth embodiment of the present disclosure. As shown in FIG. 31, the eleventh embodiment of the present disclosure, a first metal layer 71 is a metal layer electrically connected to an O pole. A second metal layer 72 and a fourth metal layer 74 are metal layers electrically connected to a P pole. A third metal layer 73 is a metal layer electrically connected to a N pole. However, the present disclosure is not limited thereto.

In this embodiment, the power module structure includes the first metal layer 71 disposed on a first reference plane. The second metal layer 72 and the third metal layer 73 are disposed on the second reference plane. The second reference plane is parallel to the first reference plane. The fourth metal layer 74 is disposed between the first reference plane and the second reference plane. The fourth metal layer 74 is electrically connected to the second metal layer 72.

The first switch 281 includes a first end and a second end. The first end of the first switch 281 is electrically connected to the second metal layer 72 and the second end of the first switch 281 is electrically connected to the first metal layer 71. The second switch 282 includes a third end and a fourth end. The third end of the second switch 282 is electrically connected to the first metal layer 71. The fourth term end of the second switch 282 is electrically connected to the third metal layer 73. In this embodiment, a projection, projected on the first reference plane or on the second reference plane, of the fourth metal layer 74 is overlapped with a projection, projected on the first reference plane or on the second reference plane, of the third metal layer 73 to form an overlapping area. The direction of the current flowing through the fourth metal layer 74 is opposite to the direction of the current flowing through the third metal layer 73. Therefore, the stray inductance of the power module is then reduced as well. Moreover, since the distance between the fourth metal layer 74 and the third metal layer 73 is extremely small, the stray inductance of the power module is further reduced.

In this embodiment, the opposite direction of the current here means that there is at least a third reference plane perpendicular to the first reference plane or the second reference plane. The third reference plane vertically cuts the overlapping area of the fourth metal layer 74 and the third metal layer 73. The current flowing through the fourth metal layer 74 and the current flowing through the third metal layer 73 pass through the third reference plane in the opposite direction. The stray inductance of the power module is then reduced since the fourth metal layer 74 and the third metal layer 73 of the power module are at least partially overlapped and the currents flow in opposite directions. Moreover, on the upper and lower surfaces of the first switch 281 and the second switches 282, there is a heat dissipation channel that exchanges heat with the environment, which can achieve the goal of double-sided heat dissipation.

In this embodiment, as shown in FIG. 31, at least a portion of the overlapping area is located between a projection, projected on the first reference plane, of a first switch area and a projection, projected on the first reference plane, of a second switch area. The first switch area is the smallest envelop area of the first switch 281. The second switch area is the smallest envelop area of the second switch 282. As shown in FIG. 31, the smallest envelope area of the first switch 281 is located at the left side of the overlapping area, and the smallest envelope area of the second switch 282 is located at the right side of the overlapping area.

Therefore, there are vacant spaces on both sides of the first switch area and the second switch area. The vacant spaces serve as the lead-out areas of the signal terminals of the first switch 281 and the second switch 282. In some embodiments, the first switch 281 is connected to the first signal terminal and the second switch 282 is connected to the second signal terminal. The first switch area and the second switch area are respectively located on two sides of the overlapping area, and the wire lead-out direction of the first signal terminal and the wire lead-out direction of the second signal terminal are respectively away from the overlapping area. As shown in FIG. 31, the wiring lead-out direction of the first signal terminal is extended from the first switch 281 to the left side, and the wiring lead-out direction of the second signal terminal is extended from the second switch 282 to the right side. With this configuration, the chip driving circuits of the first switch 281 is as the same as the chip driving circuits of the second switch 282. Therefore, the driving voltage of each chip is then the same. The chips are synchronized with the switches and the dynamic average current of the chips is then optimized.

In this embodiment, the first switches 281 are linearly disposed along a first direction and the second switches 282 are linearly disposed along the first direction. The first power terminal 31 and the second power terminal 32 are led out in the first direction, and the third power terminal 33 is led out in a direction which is opposite to the first direction. With this configuration, the wire lead-out direction of the first power terminal 31, the second power terminal 32 and the third power terminal 33 do not respectively occupy the vacant spaces on both sides of the first switch area and the second switch area. Therefore, the vacant space on the left side of the first switch 281 is used for the wire lead-out area of the signal terminal of the first switch 281. The vacant space on the right side of the second switch 282 is used for the wire lead-out area of the signal terminal of the second switch 282. With this configuration, the chip driving circuits of the first switch 281 is as the same as the chip driving circuits of the second switch 282. Therefore, the driving voltage of each chip is then the same. The chips are synchronized with the switches and the dynamic average current of the chips is then optimized.

In this embodiment, the quantity of the first switch 281 and the second switch 282 are not limited thereto. The first substrate 21 and the second substrate 22 are respectively disposed on the upper and the lower sides of the power module structure. In some embodiments, there is no substrate disposed on the upper and the lower sides of the power module structure. Therefore, the metal layer of the power module includes a wire lead frame, such that the material for the power module structure is then saved.

The first switch 281 is connected to the metal layer disposed on the inner side of the second substrate 22 by the connecting material. The second switch 282 is connected to the metal layer disposed on the inner side of the second substrate 21 by the connecting material. The connecting material is solder, sintered silver or conductive silver paste. The first switch 281 is connected to the metal layer disposed on the inner side of the first substrate 21 via the first spacer 25. The second switch 282 is connected to the metal layer disposed on the inner side of the first substrate via the second spacer 26. In some embodiments, the positions of the first switch 281 and the first spacer 25 are interchangeable. The positions of the second switch 282 and the second spacer 26 are interchangeable.

In this embodiment, the first switch 281 and the second switch 282 are vertical devices or planar devices, e.g. Insulated Gate Bipolar Transistor (IGBT), Metal Oxide Semiconductor Field Effect Transistor (MOSFET), diode or GaN devices. In some embodiments, the power module structure further includes the third spacer 63, the first connection column 61, the second connection column 62, and the clamping capacitor 52 on the basis of the embodiments of the present disclosure.

FIG. 32 shows a schematic view of a power module structure of a twelfth embodiment of the present disclosure. In this embodiment, a first metal layer 81 is a metal layer electrically connected to an O pole. A second metal layer 82 is a metal layer electrically connected to a P pole. A third metal layer 83 and a fourth metal layer 84 are metal layers electrically connected to an N pole. However, the present disclosure is not limited thereto.

In this embodiment, the first metal layer 81 is disposed on the first reference plane. The second metal layer 82 and the third metal layer 83 are disposed on the second reference plane. The second reference plane is parallel to the first reference plane. The fourth metal layer 84 is disposed between the first reference plane and the second reference plane and respectively parallel to the first reference plane and the second reference plane. The fourth metal layer 84 is electrically connected to the third metal layer 83. The first switch 281 includes a first end connected to the second metal layer 82 and a second end connected to the first metal layer 81. The second switch 282 includes a third end connected to the first metal layer 81 and a fourth end connected to the third metal layer 83.

In this embodiment, a projection, projected on the first reference plane or on the second reference plane, of the fourth metal layer 84 is overlapped with a projection, projected on the first reference plane or on the second reference plane, of the second metal layer 82 to form an overlapping area. The direction of the current flowing through the fourth metal layer 84 is opposite to the direction of the current flowing through the second metal layer 82. Therefore, the stray inductance of the power module is then reduced as well. Moreover, since the distance between the fourth metal layer 84 and the second metal layer 82 is extremely small, the stray inductance of the power module is further reduced.

In this embodiment, the opposite direction of the current here means that there is at least a third reference plane perpendicular to the overlapping area of the fourth metal layer 84 and the second metal layer 82. The current flowing through the fourth metal layer 84 and the current flowing through the second metal layer 82 pass through the third reference plane in the opposite direction. The fourth metal layer 84 and the second metal layer 82 of the power module structure are at least partially overlapped and the currents flow in opposite directions. Therefore, the stray inductance of the power module is then reduced. Moreover, on the upper and lower surfaces of the first switch 281 and the second switch 282, there is a heat dissipation channel that exchanges heat with the environment, which can achieve the goal of double-sided heat dissipation.

As shown in FIG. 32, the power module structure of FIG. 32 is similar to the first embodiment. In this embodiment, the overlapping area of the fourth metal layer 84 and the second metal layer 82 is located between a projection, projected on the first reference plane, of the first switch area and a projection, projected on the first reference plane, of the second switch area. The first switch area is the smallest envelop area of the first switch 281. The second switch area is the smallest envelop area of the second switch 282. As shown in FIG. 32, the smallest envelope area of the first switch 281 is located at the left side of the overlapping area, and the smallest envelope area of the second switch 282 is located at the right side of the overlapping area.

Therefore, there are vacant spaces on both sides of the first switch area and the second switch area. The vacant spaces serve as the lead-out areas of the signal terminals of the first switch 281 and the second switch 282. In some embodiments, the first switch 281 is connected to the first signal terminal and the second switch 282 is connected to the second signal terminal. The first switch area and the second switch area are respectively located on two sides of the first overlapping area, and the wire lead-out direction of the first signal terminal and the wire lead-out direction of the second signal terminal are respectively away from the overlapping area.

As shown in FIG. 32, the wiring lead-out direction of the first signal terminal is extended from the first switch 281 to the left side, and the wiring lead-out direction of the second signal terminal is extended from the second switch 282 to the right side. With this configuration, the chip driving circuits of the first switch 281 is as the same as the chip driving circuits of the second switch 282. Therefore, the driving voltage of each chip is then the same. The chips are synchronized with the switches and the dynamic average current of the chips is then optimized.

In this embodiment, the first switches 281 are linearly disposed along a first direction and the second switches 282 are linearly disposed along the first direction. The first power terminal 31 and the second power terminal 32 are led out in the first direction, and the third power terminal 33 is led out in a direction which is opposite to the first direction. With this configuration, the wire lead-out direction of the first power terminal 31, the second power terminal 32 and the third power terminal 33 do not respectively occupy the vacant spaces on both sides of the first switch area and the second switch area. Therefore, the vacant space on the left side of the first switch 281 is used for the wire lead-out area of the signal terminal of the first switch 281. The vacant space on the right side of the second switch 282 is used for the wire lead-out area of the signal terminal of the second switch 282. With this configuration, the chip driving circuits of the first switch 281 is as the same as the chip driving circuits of the second switch 282. Therefore, the driving voltage of each chip is then the same. The chips are synchronized with the switches and the dynamic average current of the chips is then optimized.

In this embodiment, the quantity of the first switch 281 and the second switch 282 are not limited thereto. The first substrate 21 and the second substrate 22 are respectively disposed on the upper and the lower sides of the power module structure. In some embodiments, there is no substrate disposed on the upper and the lower sides of the power module structure. Therefore, the metal layer of the power module includes a wire lead frame, such that the material for the power module structure is then saved. The first switch 281 is connected to the metal layer disposed on the inner side of the second substrate 22 by the connecting material. The second switch 282 is connected to the metal layer disposed on the inner side of the second substrate 21 by the connecting material. The connecting material includes solder, sintered silver or conductive silver paste. The first switch 281 is connected to the metal layer disposed on the inner side of the first substrate 21 via the first spacer 25 and the connecting material. The second switch 282 is connected to the metal layer disposed on the inner side of the first substrate via the second spacer 26 and the connecting material. In some embodiments, the positions of the first switch 281 and the first spacer 25 are interchangeable. The positions of the second switch 282 and the second spacer 26 are interchangeable.

In this embodiment, the first switch 281 and the second switch 282 are vertical devices or planar devices, e.g. Insulated Gate Bipolar Transistor (IGBT), Metal Oxide Semiconductor Field Effect Transistor (MOSFET), diode or GaN devices. In some embodiments, the power module structure further includes the third spacer 63, the first connection column 61, the second connection column 62, and the clamping capacitor 52 on the basis of the embodiments of the present disclosure.

Figure 33:
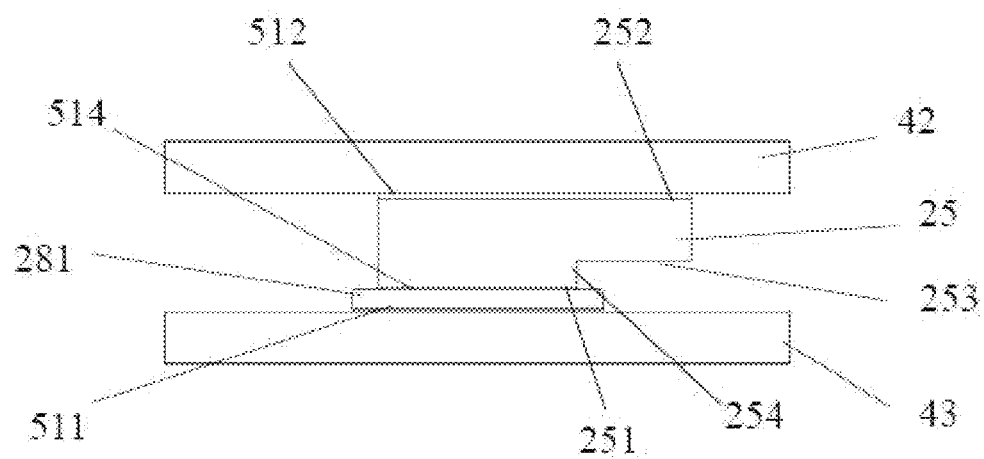
FIG. 33 to FIG. 34 shows a schematic view of a first spacer structure of one embodiment of the present disclosure; and FIG. 35 to FIG. 43 shows a schematic view of a plurality of structure types of a first spacer of some embodiments of the present disclosure.
Figure 34:
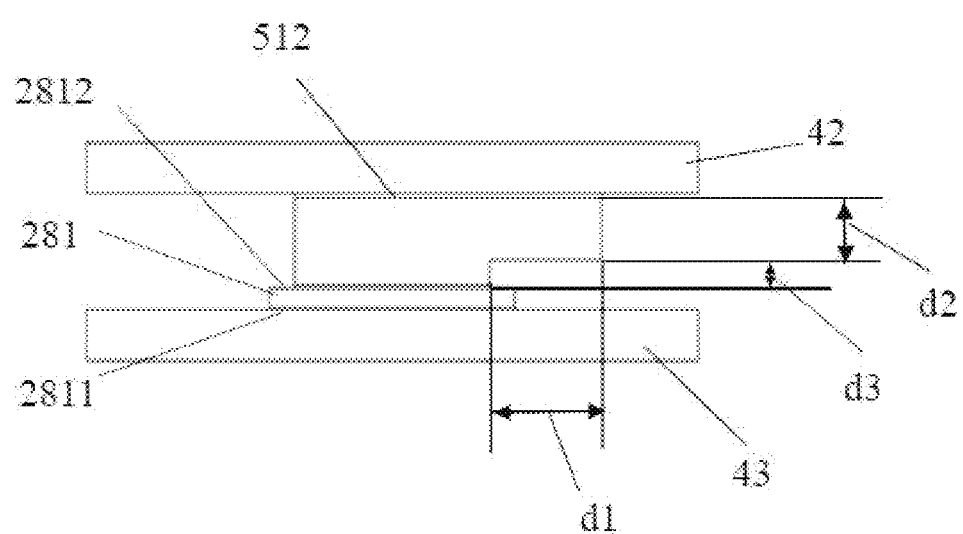

FIG. 33 and FIG. 34 show a schematic view of a first spacer structure of one embodiment of the present disclosure. The structure of the first spacer of the first embodiment, for example, is shown in FIGS. 33 and 34, and is applied to the above various embodiments to be combined into a new technical solution, which is within the protection scope of the present invention.

As shown in FIG. 33, the first spacer 25 includes a first spacer plane 251 connected to the first switch 281 and a second spacer plane 252 connected to the second metal layer 42. A projection, projected on the first reference plane, of the second spacer plane 252 is greater than a projection, projected on the first reference plane, of the first spacer plane. In some embodiments, a first end of the first switch 281 is connected, via the connecting material 511, to the third metal layer 43. A second end of the first switch 281 is connected, via the connecting material 514, to the first spacer plane 251 of the first spacer 25. The second spacer plane 252 of the first spacer 25 is connected, via the connecting material 512, to the second metal layer 42. It should be understood that the couple herein refers to indirect connect, that is, connect by a connecting material. With this configuration, the heat dissipation capability is improved and the structural strength is enhanced.

In some embodiments, an edge side of the projection, on the first reference plane, of the second spacer plane 252 is protruded an edge side of the projection, on the first reference plane, of the first spacer plane 251 a distance d1. As shown in FIG. 34, the right side of the second spacer plane 252 is protruded the right side of the first spacer plane 251 a distance d1. In this embodiment, the d1 is 0.5 to 5 mm but the present disclosure is not limited thereto. Therefore, in this embodiment, a contact area of the first spacer 25 and the second metal layer 42 is then enlarged. In some embodiments, a contact area of the first spacer 25 and the metal layer is then enlarged, wherein the metal layer is connected to the first spacer 25 via the connecting material. Therefore, the bonding strength of the first spacer 25 to the metal layer is then increased.

In this embodiment, at least one side of the first spacer plane 251 of the first spacer 25 is formed a recess facing to the second spacer plane 252. The recess includes a fourth spacer plane 254 connected to the first spacer plane 251 and a third spacer plane 253 connected to the fourth spacer plane 254. A distance d3 between the third spacer plane 253 and the first spacer plane 251 is greater than 0.1 mm, and a distance d2 between the third spacer plane 253 and the second spacer plane 252 is greater than 0.5 mm but the present disclosure is not limited thereto.

Figure 35:
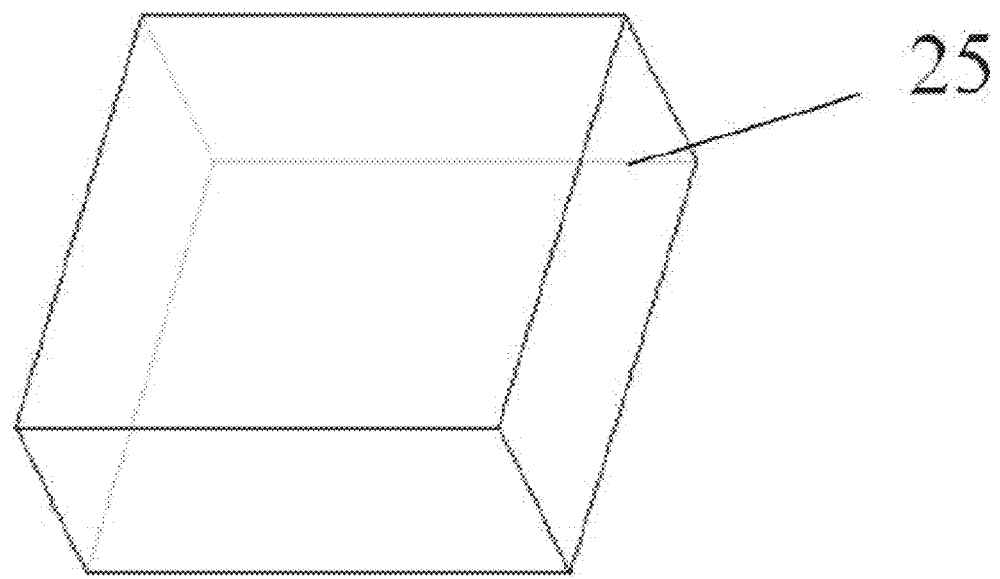

Here is one embodiment of the first spacer 25. In addition, the first spacer 25 is various in the embodiments as shown in FIGS. 35 to 43. As shown in FIG. 35, a projection, projected on the first spacer plane 251, of the second spacer plane 252 is overlapped with the first spacer plane 251.

Figure 36:
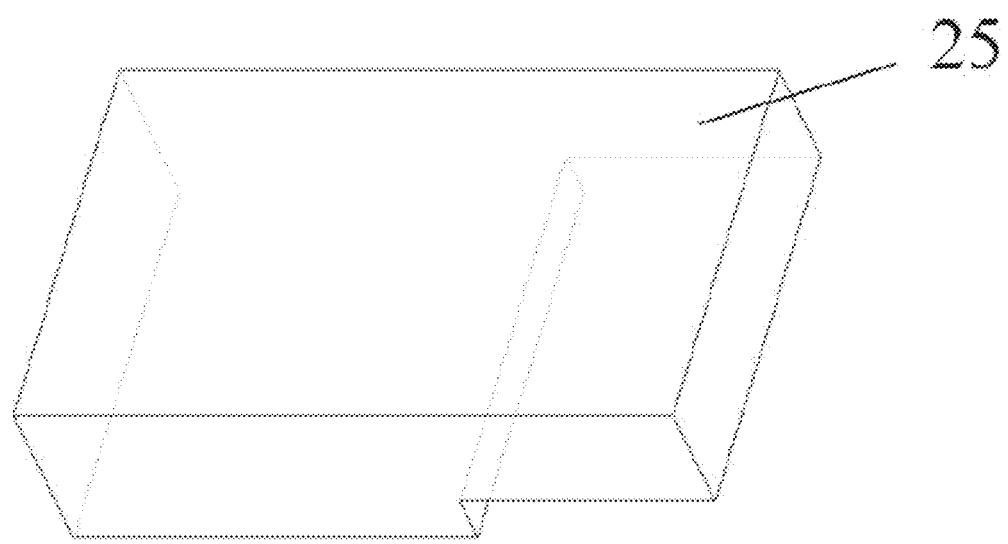
Figure 37:
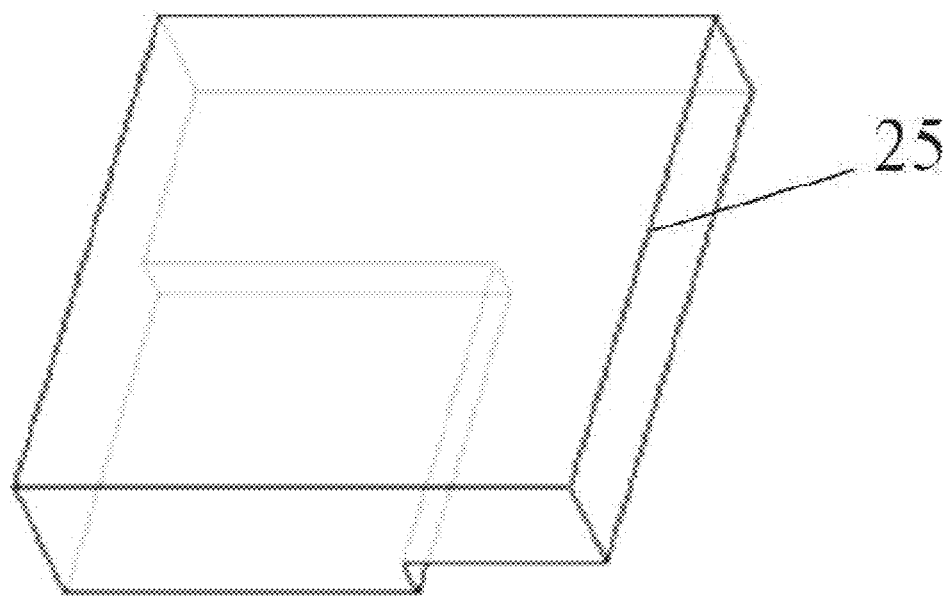
Figure 38:
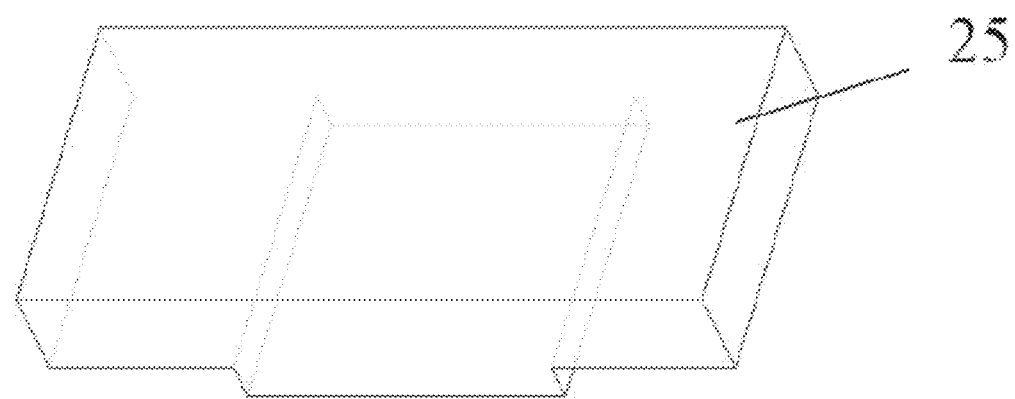
Figure 39:
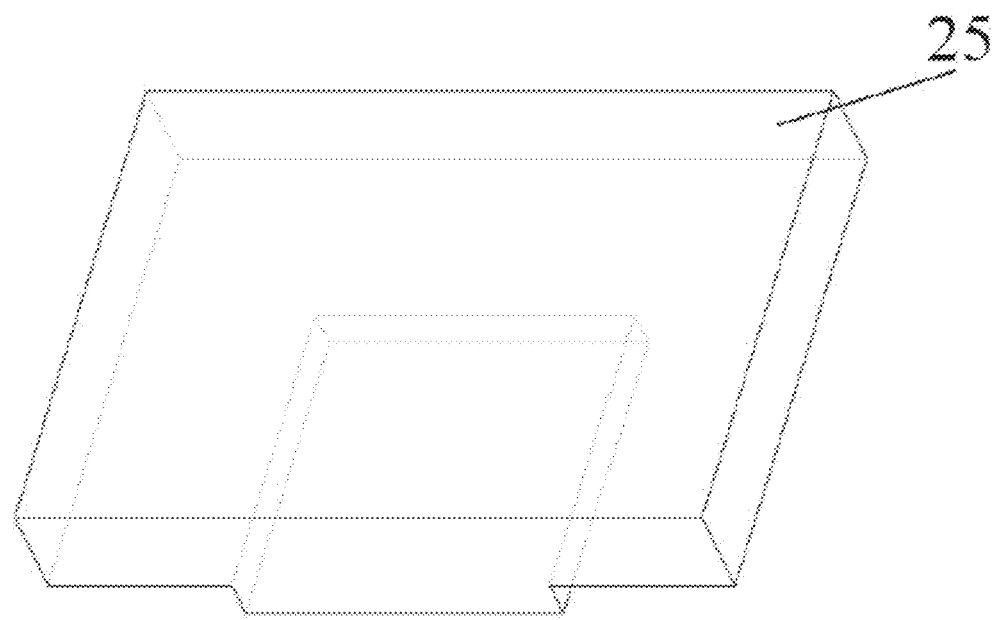
Figure 40:
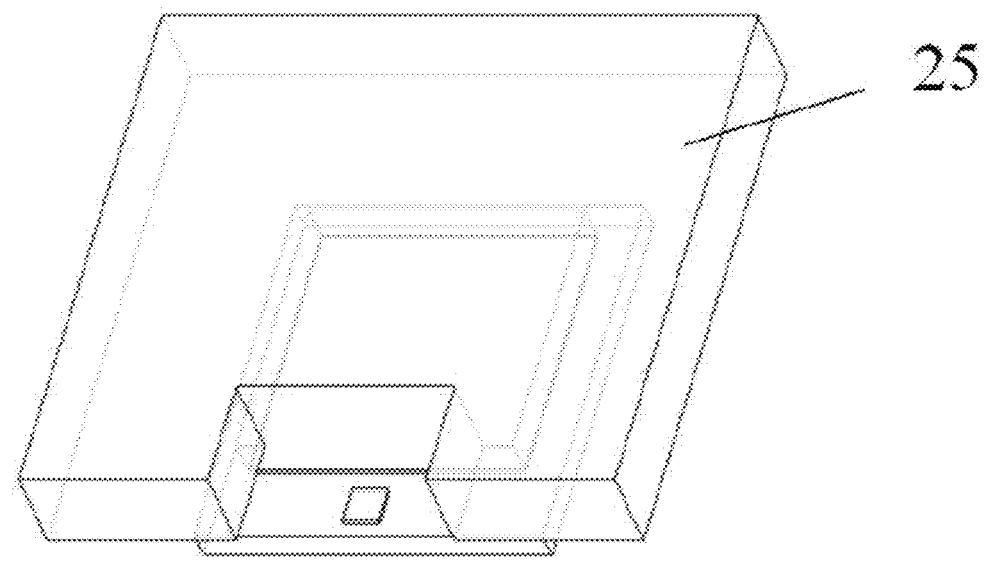
Figure 41:
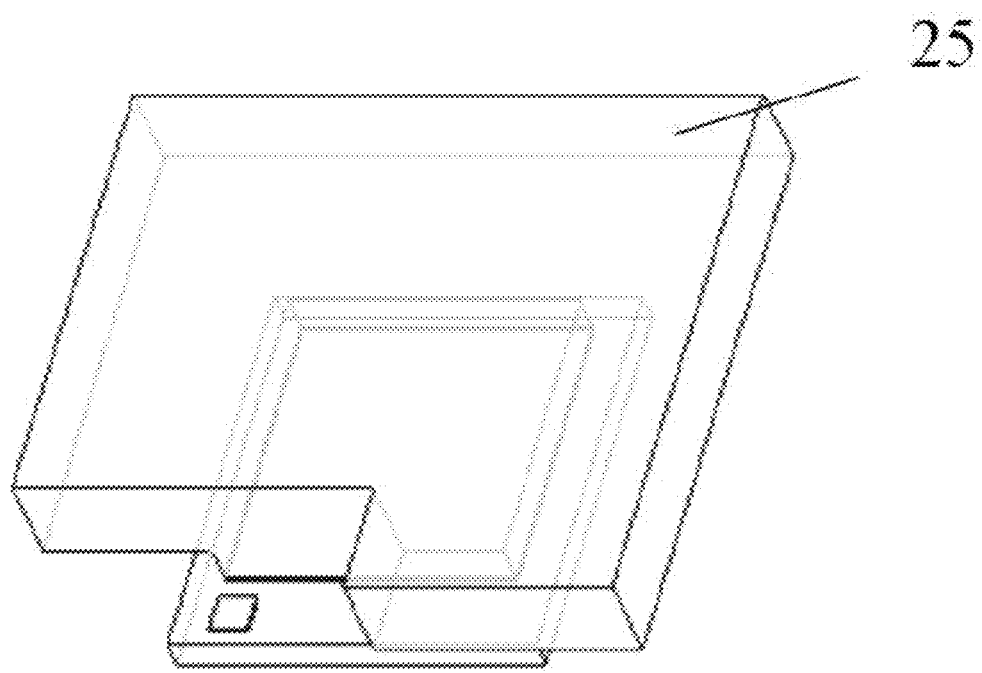

In order to increase the contact area of the second spacer plane 252 of the first spacer 25 and the second metal layer 42, as shown in FIG. 36, a projection, projected on the first spacer plane 251, is protruded one side of the first spacer plane 251. In some embodiments, as shown in FIGS. 37 and 38, a projection, projected on the first spacer plane 251, is protruded two sides of the first spacer plane 251. In some embodiments, as shown in FIG. 39, a projection, projected on the first spacer plane 251, is protruded three sides of the first spacer plane 251. In some other embodiments, a projection, projected on the first spacer plane 251, is protruded four sides of the first spacer plane 251. The first switch 281 includes a signal end beside the second end. The signal end, as shown in FIG. 40, is disposed at an intermediate portion of the edge of the first switch 281. As shown in FIG. 41, in some embodiments, the signal end is disposed at a corner of the first switch 281.

Figure 42:
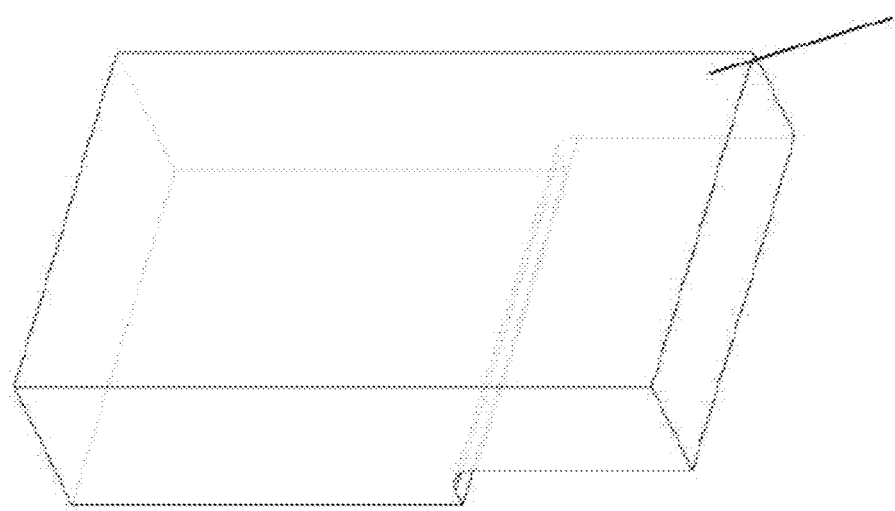
Figure 43:
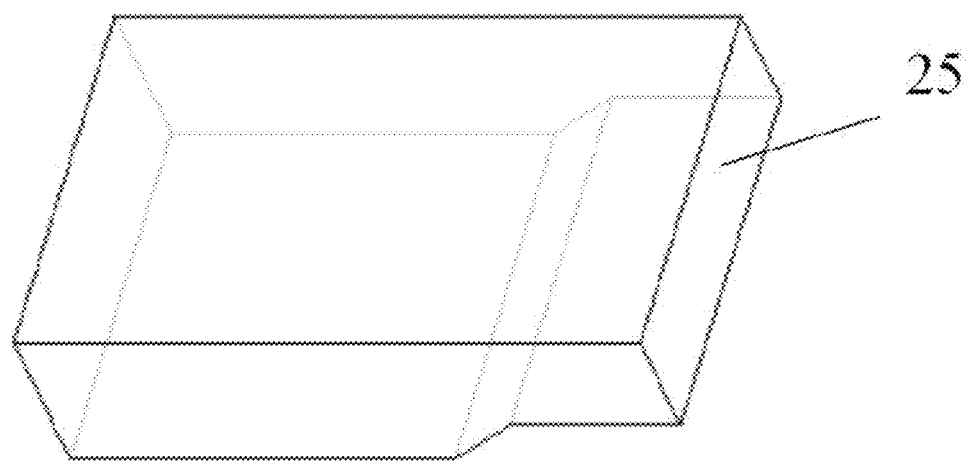

In this embodiment, the connection of the fourth spacer plane and the third spacer plane is an angle equal to 90°. But in some other embodiments, as shown in FIG. 42, the connection of the fourth spacer plane and the third spacer plane is a fillet, or as shown in FIG. 43, is an angle greater than 90°.

Moreover, in some embodiments, the second spacer 26 includes a fifth spacer plane connected to the second switch 282 and a sixth spacer plane connected to the first metal layer 41. In some embodiments, the second spacer 26 includes a fifth spacer plane connected to the second switch 282 and a sixth spacer plane connected to the fourth metal layer 44. In different embodiments, the metal layer connected to the sixth spacer plane is different. A projection, projected on the first reference plane, of the sixth spacer plane is greater than a projection, projected on the first reference plane, of the fifth spacer plane. The projection, projected on the first reference plane, of the sixth spacer plane is protruded one side of the projection, projected on the first reference plane, of the fifth spacer plane 0.5 to 5 mm. Therefore, a contact area of the sixth spacer plane and the metal layer connected to the sixth spacer plane is then enlarged and the structure strength of the power module is then enhanced.

In this embodiment, at least one side of the fifth spacer plane of the second spacer is formed a recess facing to the sixth spacer plane. The recess includes an eighth spacer plane connected to the fifth spacer plane and a seventh spacer plane connected to the eighth spacer plane. A distance between the seventh spacer plane and the fifth spacer plane is greater than 0.1 mm, and a distance between the seventh spacer plane and the sixth spacer plane is greater than 0.5 mm.

Furthermore, in some embodiments, the second spacer 26 is shown as the spacer in FIGS. 35 to 43. In one embodiment, the first spacer and the second spacer of the above embodiments are combined with the first embodiment. But in some other embodiments, the first spacer and the second spacer of the above embodiments are combined with the second embodiment to the tenth embodiment to form different embodiments of the present disclosure which are within the scope of coverage of the present disclosure. In some embodiments, the first spacer 25 and the second spacer 26 of the eleventh embodiment and the twelfth embodiment are shown in FIGS. 35 to 43. In some embodiments, the first spacer and the second spacer of the eleventh embodiment and the twelfth embodiment are combined with other embodiments to form different embodiments of the present disclosure which are within the scope of coverage of the present disclosure.

In summary, since a projection, projected on the first reference plane or on the second reference plane, of a P pole metal layer is overlapped with a projection, projected on the first reference plane or the second reference plane, of a N pole metal layer. Moreover, since the current flowing through the P pole is opposite to the current flowing through the N pole, the goal of the cancellation of the inductance is achieved and the stray inductance of the power module is then reduced.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A power module structure comprising:
    a first metal layer disposed on a first reference plane;
    a second metal layer disposed on the first reference plane, wherein the second metal layer is adjacent to the first metal layer;
    a third metal layer disposed on a second reference plane, wherein the second reference plane is parallel to the first reference plane;
    a fourth metal layer disposed on the second reference plane, wherein the fourth metal layer is adjacent to the third metal layer and is electrically connected to the second metal layer via a connecting bridge, the connecting bridge comprises a first part parallel to the first reference plane;
    at least one first switch comprising a first end electrically connected to the third metal layer and a second end electrically connected to the second metal layer; and
    at least one second switch comprising a third end electrically connected to the fourth metal layer and a fourth end electrically connected to the first metal layer;
    wherein the projection of the first metal layer and the projection of the third metal layer are overlapped on the first reference plane or on the second reference plane to form a first overlapping area;
    wherein the direction of a current passing through a third reference plane after flowing through the first metal layer is opposite to the direction of a current passing through the third reference plane after flowing through the third metal layer, wherein the third reference plane cuts the overlapping area vertically.

2. The power module structure of claim 1 further comprising a first substrate and a second substrate, wherein the first metal layer and the second metal layer are disposed on the lower surface of the first substrate, and the third metal layer and the fourth metal layer are disposed on the upper surface of the second substrate; and
    a signal terminal electrically connected, via bonding wires, to a signal end of the first switch and a signal end of the second switch.

3. The power module structure of claim 1 further including a first spacer electrically connected to the first switch, wherein the first spacer is further electrically connected to one of the second metal layer and the third metal layer, and the first switch is further electrically connected to the other of the second metal layer and the third metal layer; and
    a second spacer electrically connected to the second switch, wherein the second spacer is further electrically connected to one of the first metal layer and the fourth metal layer, and the second switch is further electrically connected to the other of the first metal layer and the fourth metal layer.

4. The power module structure of claim 3, wherein the first switch and the second switch are vertical devices, wherein the first end is electrically connected to the third metal layer and the second end is electrically connected to the first spacer electrically connected to the second metal layer; and wherein the third end is electrically connected to the fourth metal layer and the fourth end is electrically connected to the second spacer electrically connected to the first metal layer.

5. The power module structure of claim 3 further comprising a third spacer, a first connecting column and a second connecting column, wherein the first switch and the second switch are planar devices;

wherein the first end is electrically connected to the third metal layer, and the second end is electrically connected to a first connecting metal layer disposed on the second reference plane and is adjacent to the third metal layer, wherein the first connecting column is electrically connected to the first connecting metal layer and the second metal layer; and wherein the third end is electrically connected to the third spacer electrically connected to the second connecting metal layer, and the second connecting metal layer is disposed on the first reference plane and is adjacent to the first metal layer, wherein the second connecting column is electrically connected to the second connecting metal layer and the fourth metal layer; and wherein the fourth end is electrically connected to the second spacer, electrically connected to the first metal layer.

6. The power module structure of claim 3 further comprising a first connecting column and a second connecting column, wherein the first switch and the second switch are planar devices, wherein the first end is electrically connected to the third metal layer and the second end is electrically connected to a first connecting metal layer, wherein the first connecting metal layer is disposed on the second reference plane and is adjacent to the third metal layer, wherein the first connecting column is electrically connected to the first connecting metal layer and the second metal layer; and wherein the third end is electrically connected to a second connecting metal layer, wherein the second connecting metal layer is disposed on the first reference plane and is adjacent to the first metal layer, wherein the second connecting column is electrically connected to the second connecting metal layer and the fourth metal layer, wherein the fourth end is electrically connected to the first metal layer.

7. The power module structure of claim 3, wherein at least one of the first spacer and the second spacer comprises a first spacer plane electrically connected to the switches and a second spacer plane electrically connected to the metal layers, wherein a projection of the first spacer plane and a projection of the second spacer plane on the first reference plane are overlapped and the projection of the second spacer plane is greater than the projection of the first spacer plane.

8. The power module structure of claim 7, wherein an edge side of the projection, on the first reference plane, of the second spacer plane is protruded an edge side of the projection, on the first reference plane, of the first spacer plane 0.5 to 5 mm;

wherein at least one side of the first spacer plane is formed a recess facing to the second spacer plane, wherein the recess includes a fourth spacer plane connected to the first spacer plane and a third spacer plane connected to the fourth spacer plane, wherein the distance between the third spacer plane and the first spacer plane is greater than 0.1 mm, and the distance between the third spacer plane and the second spacer plane is greater than 0.5 mm.

9. The power module structure of claim 1, wherein the connecting bridge is evenly disposed between the first switch and the second switch.

10. The power module structure of claim 9 further comprising a flat clamping capacitor and a capacitor connecting spacer, wherein the flat clamping capacitor and the capacitor connecting spacer are disposed on the outside of the connecting bridge, wherein one end of the flat clamping capacitor is electrically connected to the third metal layer and the other end of the flat clamping capacitor is electrically connected to the first metal layer via a third connecting metal layer and the corresponding capacitor connecting spacer.

11. The power module structure of claim 9 further comprising a flat clamping capacitor and a capacitor connecting spacer, wherein the flat clamping capacitor and the capacitor connecting spacer are disposed in a hollow portion of the connecting bridge, wherein one end of the flat clamping capacitor is electrically connected to the third metal layer and the other end of the flat clamping capacitor is electrically connected to the first metal layer via a third connecting metal layer and the corresponding capacitor connecting spacer.

12. The power module structure of claim 1 further comprising:

a first power terminal electrically connected to the third metal layer;

a second power terminal electrically connected to the first metal layer; and a third power terminal electrically connected to the connecting bridge;

wherein the projection of the first power terminal and the projection of the second power terminal are overlapped on the first reference plane or on the second reference plane;

wherein a projection, projected on the first reference plane or projected on the second reference plane, of a connecting area of the first metal layer and the second power terminal is overlapped with a projection, projected on the first reference plane or projected on the second reference plane, of a connecting area of the third metal layer and the first power terminal;

wherein the first switches are linearly disposed along a first direction and the second switches are linearly disposed along the first direction, wherein the first power terminal and the second power terminal are led out in the first direction, and the third power terminal is led out in a direction which is opposite to the first direction.

13. The power module structure of claim 1, wherein each first switch and each second switch are serially connected as a pair, and the pairs are arranged in parallel.

14. The power module structure of claim 1 further comprising a clamping capacitor disposed between the first reference plane and the second reference plane and electrically connected between the third metal layer and the first metal layer.

15. The power module structure of claim 1 further comprising a flat clamping capacitor and a capacitor connecting spacer, wherein the flat clamping capacitor and the capacitor connecting spacer are disposed between the first switch and the second switch, wherein one end of the flat clamping capacitor is electrically connected to the third metal layer and the other end of the flat clamping capacitor is electrically connected to the first metal layer via the corresponding capacitor connecting spacer.

16. The power module structure of claim 1 further comprising an upright clamping capacitor disposed between the first switch and the second switch, wherein one end of the upright clamping capacitor is electrically connected to the third metal layer and the other end of the upright clamping capacitor is electrically connected to the first metal layer.

17. The power module structure of claim 1, wherein at least a portion of the first overlapping area is located between a projection of the first switch area on the first reference plane and a projection of the second switch area on the first reference plane, wherein the first switch area is a minimum envelope area of the first switch, and the second switch area is a minimum envelope area of the second switch.

18. The power module structure of claim 17, wherein a first signal terminal is electrically connected to the first switch and a second signal terminal is electrically connected to the second switch, wherein the lead-out direction of a wire of the first signal terminal and the lead-out direction of a wire of the second signal terminal are respectively extended away from the first overlapping area.

19. The power module structure of claim 1, wherein a projection, projected on the first reference plane or projected on the second reference plane, of the connecting bridge is overlapped with the first overlapping area.

20. The power module structure of claim 1, wherein a projection of the second metal layer is overlapped with a projection of the fourth metal layer, on the first reference plane or on the second reference plane, to form a second overlapping area, wherein a projection of the connecting bridge, on the first reference plane or on the second reference plane, is located within the coverage of the second overlapping area.

* * * * *